(12) United States Patent
Jorgenson

(10) Patent No.: US 8,253,157 B2
(45) Date of Patent: Aug. 28, 2012

(54) III-NITRIDE LIGHT-EMITTING DEVICES WITH REFLECTIVE ENGINEERED GROWTH TEMPLATES AND METHODS OF MANUFACTURE

(75) Inventor: Robbie J. Jorgenson, San Diego, CA (US)

(73) Assignee: Lightwave Photonics, Inc., Encinitas, CA (US)

( * ) Notice: Subject to any disclaimer, the term of this patent is extended or adjusted under 35 U.S.C. 154(b) by 0 days.

(21) Appl. No.: 13/075,104

(22) Filed: Mar. 29, 2011

(65) Prior Publication Data

US 2012/0001213 A1 Jan. 5, 2012

Related U.S. Application Data

(62) Division of application No. 11/882,730, filed on Aug. 3, 2007, now Pat. No. 7,915,624.

(60) Provisional application No. 60/821,588, filed on Aug. 7, 2006, provisional application No. 60/835,934, filed on Aug. 6, 2006.

(51) Int. Cl.
*H01L 29/20* (2006.01)
*H01L 33/60* (2010.01)

(52) U.S. Cl. ........................................ 257/98

(58) Field of Classification Search .................... 257/13, 257/94, 79, 86, 98, 592, 929, 81, 82, 91, 257/99, 100, 116, 117, 432–437, 749, E33.056–E33.059, E25.032, E21.086, E21.097–E21.1, 257/E21.108–E21.113, E21.117–E21.118, 257/E21.542, E21.697–E21.699, E31.371, 257/E21.387, E21.403–E21.407, E21.441, 257/E21.445, E21.448–E21.452, 11, 12, 257/51, 85, 90, 96, 97, 183; 438/29, 46, 438/22, 39, 40, 41, 44, 47, 222, 226, 241, 438/269, 363, 384, 388, 413, 416, 429, 442, 438/478, 481, 486, 489, 492–509, 607, 903, 438/969, 77, 84, 93–95, 102, 401, 188, 189, 438/285, 603–604, 606, 930–933
See application file for complete search history.

(56) References Cited

U.S. PATENT DOCUMENTS 4,780,749 A  10/1988 Schulman
5,557,627 A   9/1996 Schneider et al.
(Continued)

FOREIGN PATENT DOCUMENTS

WO  WO 03098710 A1  11/2003

OTHER PUBLICATIONS

Chen, N.C., et al., "Nitride light-emitting diodes grown on Si (111) using a TiN template", "Applied Physics Letters", May 10, 2006, pp. 191110-1-191110-3, vol. 88, No. 191110.

(Continued)

*Primary Examiner* — Dao H Nguyen
*Assistant Examiner* — Tram H Nguyen
(74) *Attorney, Agent, or Firm* — David J. King; Charles A. Lemaire; Lemaire Patent Law Firm, P.L.L.C.

(57) ABSTRACT

A light emitter includes a first mirror that is an epitaxially grown metal mirror, a second mirror, and an active region that is epitaxially grown such that the active region is positioned at or close to, at least, one antinode between the first mirror and the second mirror.

20 Claims, 17 Drawing Sheets

U.S. PATENT DOCUMENTS

| | | | |
|---|---|---|---|
| 5,619,059 A | 4/1997 | Li et al. | |
| 5,966,393 A | 10/1999 | Hide et al. | |
| 6,045,626 A | 4/2000 | Yano et al. | |
| 6,100,545 A | 8/2000 | Chiyo et al. | |
| 6,420,199 B1 * | 7/2002 | Coman et al. | 438/22 |
| 6,426,512 B1 | 7/2002 | Ito et al. | |
| 6,531,719 B2 | 3/2003 | Shibata et al. | |
| 6,563,141 B1 | 5/2003 | Dawson et al. | |
| 6,573,537 B1 | 6/2003 | Steigerwald et al. | |
| 6,589,808 B2 | 7/2003 | Chiyo et al. | |
| 6,614,060 B1 | 9/2003 | Wang et al. | |
| 6,784,085 B2 | 8/2004 | Cuomo et al. | |
| 6,800,500 B2 | 10/2004 | Coman et al. | |
| 6,872,965 B2 | 3/2005 | Ito et al. | |
| 6,929,867 B2 | 8/2005 | Armitage et al. | |
| 6,943,377 B2 | 9/2005 | Gaska et al. | |
| 6,969,874 B1 | 11/2005 | Gee et al. | |
| 7,030,417 B2 | 4/2006 | Ishibashi et al. | |
| 7,148,520 B2 | 12/2006 | Yoo | |
| 7,176,483 B2 | 2/2007 | Grupp et al. | |
| 7,215,692 B2 | 5/2007 | Jewell | |
| 7,223,998 B2 | 5/2007 | Schwach et al. | |
| 7,279,347 B2 | 10/2007 | Hon et al. | |
| 7,332,365 B2 | 2/2008 | Nakamura et al. | |
| 7,335,924 B2 | 2/2008 | Liu et al. | |
| 7,345,315 B2 | 3/2008 | Hon et al. | |
| 7,368,316 B2 | 5/2008 | Yokouchi et al. | |
| 7,465,592 B2 | 12/2008 | Yoo | |
| 7,825,006 B2 | 11/2010 | Nakamura et al. | |
| 2006/0054905 A1 * | 3/2006 | Schwach et al. | 257/89 |
| 2006/0202211 A1 | 9/2006 | Ueda et al. | |
| 2006/0273324 A1 | 12/2006 | Asai et al. | |
| 2007/0045607 A1 | 3/2007 | Chen et al. | |
| 2007/0096127 A1 | 5/2007 | Pattison et al. | |

OTHER PUBLICATIONS

Shen, Y.C., et al., "Optical cavity effects in InGaN-GaN quantum-well-heterostructure flip-chip light-emitting diodes", "Applied Physics Letters", Apr. 7, 2003, pp. 2221-2223, vol. 82, No. 14.

* cited by examiner

Prior Art    Fig. 4

III-NITRIDE LIGHT-EMITTING DEVICES WITH REFLECTIVE ENGINEERED GROWTH TEMPLATES AND METHODS OF MANUFACTURE

CROSS-REFERENCE TO RELATED APPLICATIONS

The present application is a divisional of and claims benefit of U.S. patent application Ser. No. 11/882,730 filed Aug. 3, 2007, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" (which issued as U.S. Pat. No. 7,915,624 on Mar. 29, 2011), which claims the benefit under 35 U.S.C. Section 119(e) of the following U.S. provisional patent applications:

U.S. Provisional Patent Application No. 60/835,934, filed on Aug. 6, 2006, by R. J. Jorgenson, entitled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS"; and U.S. Provisional Patent Application No. 60/821,588, filed on Aug. 7, 2006, by R. J. Jorgenson, entitled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS";

each of which non-provisional and provisional patent applications is incorporated herein by reference in its entirety.

BACKGROUND

1. Field of Invention

The invention is related to semiconductor light emitters.

2. Description of Related Art

Throughout this application, references are cited. The respective disclosure of each of these references is incorporated in its entirety by reference.

Light emitting diodes (LEDs) are semiconductor devices that generate light from electrical excitation where electrons and holes combine to annihilate, and thereby forming photons.

These structures are typically grown on sapphire or silicon carbide substrates by OMVPE (Organo-Metalic Vapor Phase Epitaxy).

FIG. 1 shows one example of an OMVPE grown standard group III-nitride semiconductor LED that comprises of a sapphire substrate (101), an intrinsically doped gallium nitride (GaN) buffer layer 2 μm thick (102), a silicon doped 2 μm n-type GaN layer (103), an Indium Gallium Nitride (InGaN) active region (104) comprised of a single quantum well or multiple quantum wells, a current blocking layer (105) comprising of magnesium doped p-type AlGaN, and a magnesium doped p-type GaN layer (106).

This LED structure is epitaxially grown on a substrate, which in this case is sapphire, such that several LEDs are formed on the surface of the substrate and electrical terminals (207) (208) are positioned on the n-type GaN layer (203) and the p-type GaN layer (206) of each single LED as shown in FIG. 2.

Group III-nitride LEDs require a thick GaN buffer layer (102) of about 2 μm when grown on a nonconductive sapphire substrate as described in U.S. Pat. No. 4,855,249 (Isamu Akasaki et al., Aug. 8, 1989) and U.S. Pat. No. 5,686,738 (Theodore D. Moustakas, Nov. 11, 1997). This is to achieve device quality material before the n-type layer (103), active region (104) and p-type layers (105) (106) of the device are grown. Although there are other methods, generally this extended 2 μm thickness is desirable to allow the GaN buffer (102) to coalesce during growth resulting in device quality material.

Standard group III-nitride semiconductor LEDs usually have low light extraction due to the refractive index contrast between the semiconductor ($N_{GaN}$=2.4) and air ($N_{air}$=1). Most of the light emitted inside an LED is unable to escape through Snell's window to reach the outside medium (air), and thus has about 6% extraction efficiency from the extraction surface of the LED.

One method to improve light extraction may involve shaping the light exiting surface of the device to reduce the amount of generated light that is lost to total internal reflection as described in U.S. Pat. No. 5,779,924 (Michael R. Krames et al., Jul. 14, 1998). A shaping technique that improves light extraction comprises random texturing of the device surface to achieve light scattering.

Another light extraction enhancement approach is to form a layer with a photonic crystal structure as described in U.S. Pat. No. 6,831,302 (Alexei A. Erchak et al., Dec. 14, 2004). If designed accordingly, a photonic crystal may inhibit guided modes so that more light is extracted through vertical modes or direct guided modes out of the device by diffraction. Surface texturing and photonic crystal structures suffer from added complexity due to extra techniques and processing steps which may include extra layer formation or etching steps.

As shown in FIG. 3, some III-nitride LEDs utilize a metal mirror contact (308) on the p-type GaN layer (306) side of the device as described in U.S. Pat. No. 6,573,537 (Daniel A. Steigerwald et al., Jun. 3, 2003). The metal mirror contact is deposited after the epitaxial process. In this example the metal mirror contact (308) covers the entire p-GaN layer (306). Adjusting the p-GaN layer thickness and as a result positioning of the mirror allows the device to utilize optical cavity (309) effects as seen in FIG. 3 and FIG. 4. Light emitted from the active region (304) self interferes due to reflection from the closely placed metal mirror (308). Optical cavity effects may increase the light emission into the vertical modes while reducing the total number of horizontal optical modes. In this example, vertical modes are readily extracted through a transparent substrate though Snell's window. Positioning the center of the active region (304) of the LED at, or close to, a maximum (402) of the optical field distribution (401) as shown in FIG. 4, assists in light extraction. The local maximums (402) of the optical field distribution (401) are referred to as antinodes (402) because they are antinodes of the standing optical wave. Generally, positioning the center of the active region (304) at or close to the closest antinodes (402) to the metal contact (308) is desired to allow more light through Snell's window. As shown in FIG. 4, antinodes (402), of the standing optical wave (401), are positioned periodically away from the metal contact (308).

The above mentioned light extraction approaches are more easily applied to the p-type GaN layer side of the device which is readily accessible for further processing after the epitaxial crystal growth is completed. Because the sapphire substrate is nonconductive and it is preferred to grow the conductive n-type GaN layer side first, the n-type GaN layer side becomes buried and difficult to access from the substrate side for further processing due to the extreme hardness of sapphire.

Dual-mirrored resonant cavity light emitting diodes (RCLEDs) or microcavity light emitting diodes (MCLEDs)

represent a further method of increasing light extraction from a semiconductor light emitting device. The active region is located within an LED in such a way as to create an optical cavity between two properly placed mirrors that direct light emission into vertical modes or a single mode by reducing the total number of optical modes within an LED.

Coupling a highly reflective mirror with a partially reflective mirror to create a cavity has been predicted to increase light extraction efficiencies in the 30% to 50% range over standard LEDs as mentioned within U.S. Pat. No. 6,969,874 (Gee et al., Nov. 29, 2005).

The key to a properly functioning cavity LED is the placement of the mirrors relative to the active region to obtain resonance and constructive interference.

Coupling a metal mirror on the outer p-type III-nitride surface of a LED to an active region placed at or close to an antinode of an standing optical wave can be performed relatively easily with standard deposition techniques as described in U.S. Pat. No. 6,573,537 (Daniel A. Steigerwald et al., Jun. 3, 2003).

One technique to couple a mirror within the n-type III-nitride region at or close to an antinode of an standing optical wave includes the epitaxial growth of Distributed Bragg Reflectors (DBRs) composed of alternating layers of semiconductor materials, each with different refractive indexes and quarter wavelength thicknesses. A large number of these layers may be required to achieve sufficient reflectivity for the optical cavity.

While these DBRs may be grown epitaxially, they have a number of inherent disadvantages. The alternating material layers often suffer from a lattice mismatch that may lead to increased wafer cracking, poorer crystal quality, reduced yield, lower uniformity, and higher manufacturing cost. Moreover, DBRs are more electrically resistive, compared to metal or other semiconductor materials, resulting in poor current injection into the device.

U.S. Pat. No. 6,969,874 (Gee et al., Nov. 29, 2005) discloses a Flip-Chip Light Emitting Diode with a Resonant Optical Microcavity using a DBR at or close to an antinode of an standing optical wave. The DBR specified for the device uses better lattice matched materials and requires fewer alternating layers compared to previous DBR configurations. Nevertheless, while potentially an improvement over previous DBRs, the device has not adequately solved the manufacturing complexities or conductivity shortcomings inherent in DBR material composition.

Another method to place a mirror within the n-type III-nitride region comprises of removing the base substrate and any buffer layers, followed by a thinning and polishing of the n-type III-nitride layer in such a way as to create an interfacial mirror located optimally for the microcavity.

U.S. Patent Application Publication 2007/0096127 (P. Morgan Pattison, May 3, 2007) discloses a MCLED with an interfacial mirror on the n-type side of a III-nitride device coupled with a metal mirror deposited on the p-type III-nitride side of the device and an enclosed active region placed at or close to an antinode of an standing optical wave between the two reflective surfaces.

Fabrication of this MCLED requires laser-lift-off, as described in U.S. Pat. No. 6,071,795 (Nathan W. Cheung et al., Jun. 6, 2000), to remove the substrate. Additionally the n-type III-nitride layer must be etched to a precise and accurate thickness to create an optimally positioned interfacial mirror relative to the active region and a highly reflective metal mirror deposited on the p-type III-nitride surface of the device.

While this approach has been shown to function, the process of laser-lift-off and subsequent etching is difficult to commercialize and to obtain high yields.

What is desired is a microcavity LED structure that does not require cumbersome material removal or complicated layering. Further it is desirable to combine various light extraction structures as described above while allowing for high current injection.

SUMMARY

Device structures utilizing optical cavity effects for enhanced light extraction comprising of an active region of an optimized thickness and placement with respect to light extraction features and with respect to various configurations of an epitaxially grown metal mirror is described. For purposes of this disclosure, these embedded mirrors (or mirror configurations) are defined as Grown-Epitaxial-Metal-Mirror (GEMM), or the GEMM layer.

In some examples, device structures may comprise an optical cavity that comprises one GEMM and a second mirror. The second mirror may be a Distributed Bragg Reflector (DBR), non-epitaxially grown metal mirror, interfacial mirror, a GEMM, or any other mirror structure. In other examples, said second mirror may be substituted with a roughened surface, a photonic crystal, or other light extraction structures. Any combination of light extraction structures may be coupled with the GEMM. There are many variations that may be employed including combining multiple light extraction structures on one or both sides.

In some configurations, light may propagate through the top of the device, away from the substrate side. In other configurations, light may propagate through a transparent substrate at the bottom of the device in the form of a "Flip Chip" MCLED or RCLED. In other configurations the light may exit more than one direction.

To create a resonant cavity device, the GEMM may be placed at or close to a standing optical wave node to create constructive interference between the light generated by the active region and the reflected light from the GEMM. This enables light to be directed into modes (or a single mode) to increase the amount of light propagating out of the LED. Light generated by optical cavity devices are more directional and spectrally pure compared to standard LEDs.

The GEMM may be grown fully non-transparent and highly reflective as per its bulk material properties or grown semi-transparent to fit the requirements of the different device structures by simply adjusting the GEMM growth time, and thus thickness during epitaxy. The materials used for the GEMM closely match the lattice constant of the III-nitride layers and are grown of device quality.

Appropriately utilized GEMM layers have a number of advantages over current appropriately utilized device structure components like Distributed Bragg Reflectors (DBRs) or non-epitaxial mirrors.

For example, GEMM layers may not require the layering of numerous alternating semiconductor materials, like DBRs, that may create defects and cracks.

Embedding a planar specular GEMM layer within a light emitting device structure, such that optical cavity structures described herein are formed, may not involve material removal such as laser-lift-off or material etching. The steps to create these alternative structures with the GEMM are less process intensive and more easily commercialized compared to other structures described above.

Additionally, the GEMM layer may be used as a conductive layer to increase electrical current injection and current distribution. Furthermore, the superior current distribution may improve electrostatic discharge reliability.

DETAILED DESCRIPTION OF THE EMBODIMENTS

Figure 1:
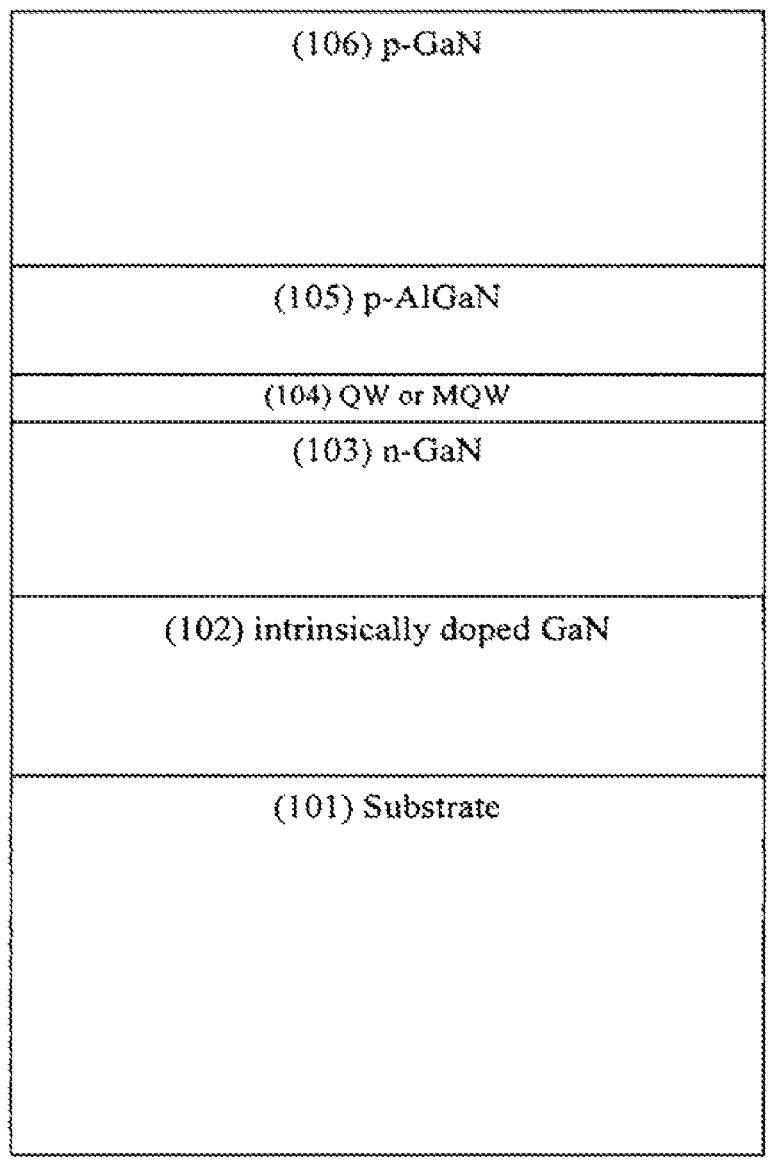
FIG. 1 illustrates an epitaxial stack of a standard III-nitride LED.
Figure 2:
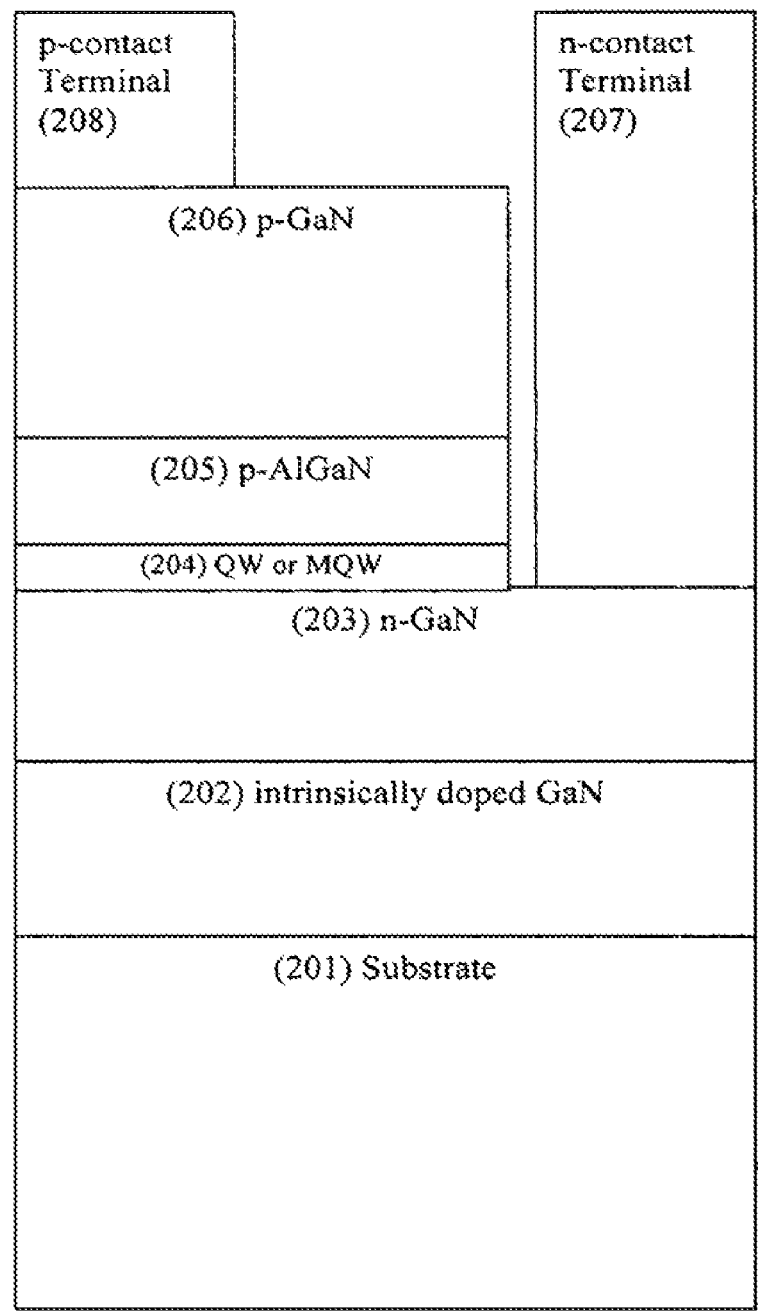
FIG. 2 illustrates a standard III-nitride LED after processing.
Figure 3:
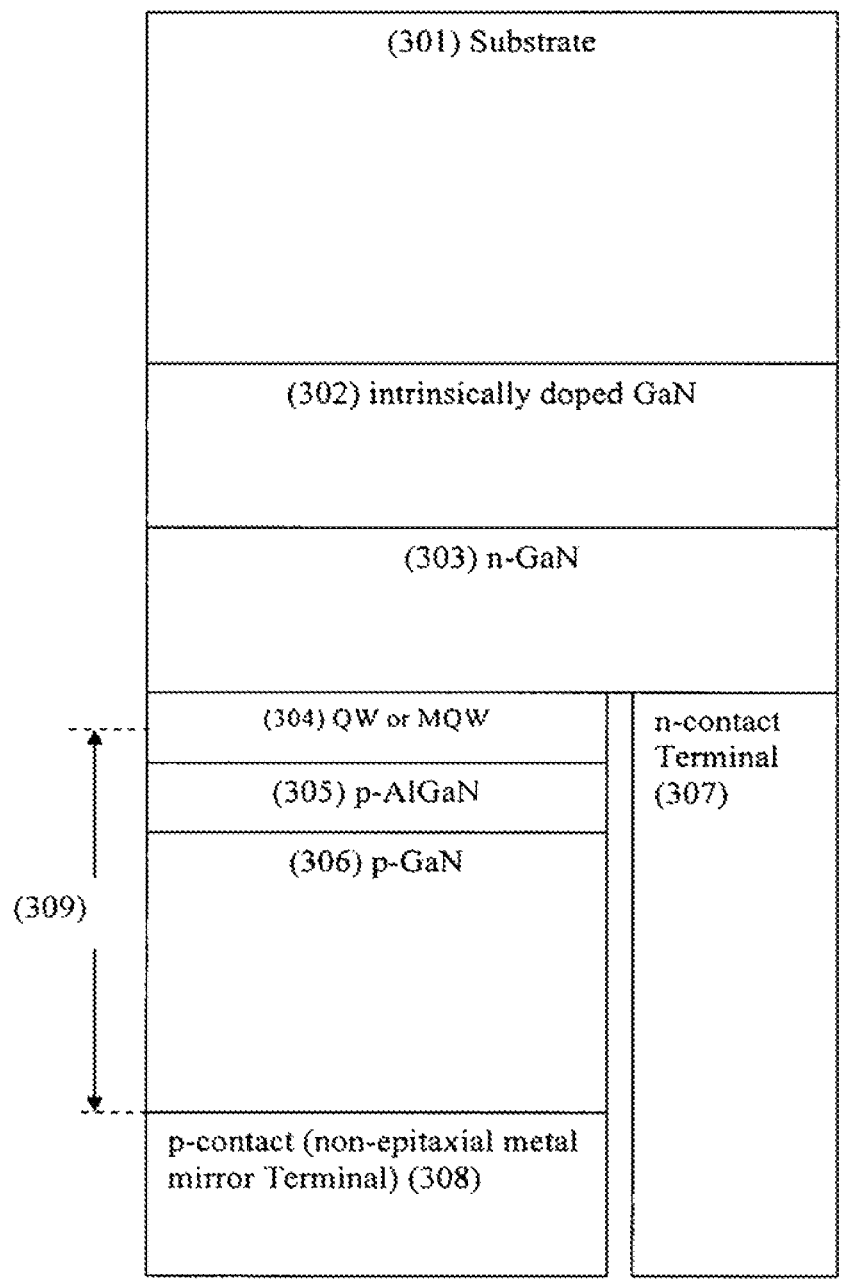
FIG. 3 illustrates a standard III-nitride LED with a non-epitaxial metal mirror contact (308) for enhanced light extraction.
Figure 4:
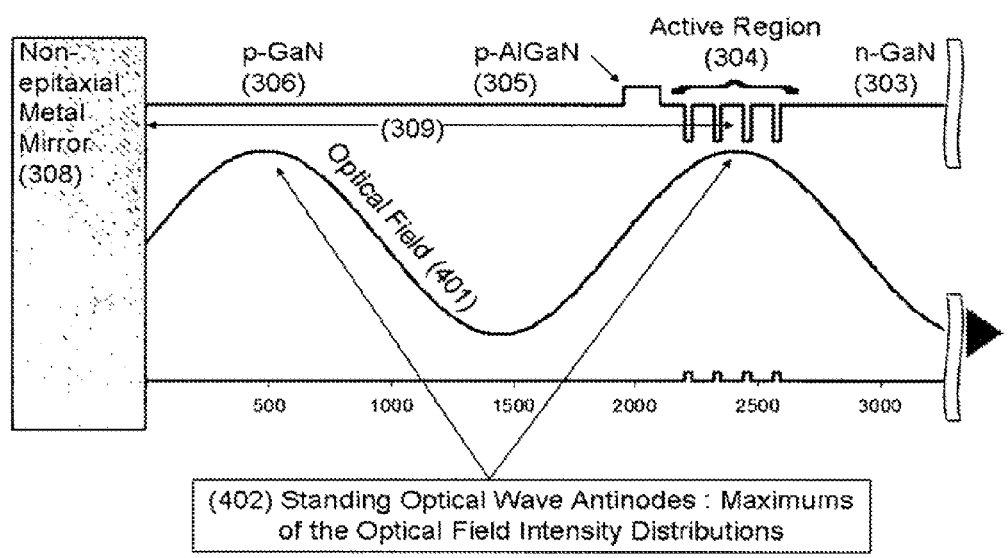
FIG. 4 illustrates a conduction and valence band diagram of standard III-nitride LED with a non-epitaxial metal mirror contact for enhanced light extraction with optical field approximated.

In the following description of the embodiments, reference is made to the accompanying drawings which form a part hereof, and in which is shown by way of illustration specific embodiments in which the invention may be practiced. In the drawings, the thickness of layers and regions are exaggerated for clarity. These embodiments are provided so that this disclosure will be thorough and complete, and will convey the teachings to those skilled in the art. It is to be understood that other embodiments may be utilized and structural changes may be made without departing from the scope of the present invention.

Semiconductor light emitting structures and devices are described where the emitting structure is grown upon a GEMM where the GEMM has been epitaxially grown above previously grown III-nitride layers or layer, thus allowing the GEMM to be positioned with great precision and accuracy within the epitaxial structure for the purpose of creating optical cavity effects (including microcavity effects) for greater light extraction. Moreover, due to the mirror being grown epitaxially, the thickness of the mirror may be controlled to form either a semi-reflector, or non-transparent reflector. Various structures of a single mirrored or duel mirrored RCLED or MCLED may be grown and fabricated by use of one or more GEMM layer as well as other structures.

The GEMM may be positioned with respect to an active region such that emitted light from the active region and the light reflected from the GEMM constructively interfere to create optical cavity effects that enhances device efficiency and tailors the spectral purity and spectral directionality for different applications in lighting, fiber optic communications, biological agent detection, flat panel displays and other applications.

Having the GEMM and the active region in an optimally coupled configuration may allow for a second mirror, a photonic crystal or roughened surface to be additionally coupled to enhance or tailor light emitting characteristics.

The thickness of the GEMM may be configured during the growth process to fine tune the mirror's reflective and transmissive optical properties, from partially transmissive to fully transmissive. Such control during epitaxial growth provides the flexibility to optimize optical cavity effects for a multitude of semiconductor light emitting devices.

The device quality GEMM, which will be further described below, may be placed within the difficult to access n-type III-nitride layer near the active region of a conventional III-nitride semiconductor light emitter epitaxial stack. Those skilled in the art will understand that in standard III-nitride LEDs the n-type layer is usually grown prior to p-type layer(s) during the epitaxial growth process. Generally, the GEMM provides a mirror embedded within the epitaxial stack to provide optical cavity effects despite which doped layer is grown first or where the GEMM layer is grown within the epitaxial stack. The GEMM layer may also serve as an embedded highly conductive electric carrier transport layer across the device to improve current injection into either n-type or p-type layers. Additionally, the GEMM may reduce problematic static discharge damage.

The material for the GEMM comprises various metals and metal compounds which may be grown closely lattice matched to its base III-nitride structure, avoiding the difficulties of high dislocation densities. Moreover, the GEMM materials are thermal expansion matched to the III-nitride structure further avoiding difficulties of cracking and dislocation densities.

The GEMM layer may comprise of refractory metals and/or metallic compounds, such as the Group IVB metals Zr, Hf, ($Hf_xZr_{1-x}$, where x is equal to or between 0 and 1), and the Transitional Metal Diborides $ZrB_2$, $HfB_2$, $YB_2$ and ($Hf_xZr_yY_zB_2$ where x+y+z=1) and the Transitional Metal Nitrides ZrN, HfN, TiN and ($Hf_xZr_yY_zN$ where x+y+z=1).

The bulk conductivity of the GEMM materials are about 30 times more conductive than the moderately doped n-type III-nitride layers currently incorporated into light emitting structures. The highly conductive properties of the GEMM may serve to improve the electronic carrier transport across the device, creating pathways for current to flow, and reduce the impact of unwanted static discharge.

The superior conductivity of the GEMM may make it attractive to epitaxially grow the highly resistive p-type materials of the III-nitride light emitting devices prior to the active region and the n-type material allowing for more design flexibility for surface texturing of the top n-type epitaxial layer, away from the substrate side.

Technical Considerations Using GEMM

The details of the photon-emission process in LEDs are, in general, related to the coupling of the light emission with electromagnetic modes.

Without the introduction of a cavity, a uniform spontaneous emitter emits evenly within the bulk material and emission covers all $4\pi$ of solid angle.

Of all the light emitted inside the bulk material, only the emission that propagates between the normal and the critical angle $\theta_c = \sin^{-1}(N_{OUT}/N_{GaN})$ to the interface of the bulk material and the external medium may escape from the bulk material into the external medium, whether or not, there is a cavity. This escape "window" is known as Snell's window.

The extraction efficiency of the LED is equal to the ratio of modes that fall within the critical angle $\theta_c$, compared to the modes that are generated.

When the optical electromagnetic modes are confined in one or more dimensions there is a reorganization of what could be considered a free space optical mode density. This rearrangement of the free space optical mode density diminishes some frequencies and enhances others while also changing the path of the emission.

The cavity extracted emission only propagates within discrete modes, and thus directions governed by the cavity. Each mode equally contains a portion of the total emitted power.

The extraction efficiency of a standard LED or RCLED is equal to the amount of light that escapes the Snell's window compared to the amount of light generated. However, the changes of the RCLEDs internal emission distribution due to the optical confinement directs more light out of Snell's window than the bulk type LED.

Although the RCLED has a higher emission output than a standard LED, changing the cavity length of a RCLED, for the most part, does not change the emission output as the active region is placed at or close to various antinodes of a standing optical wave. In the RCLED regime, as the cavity length is decreased, the ratio of modes extracted through Snell's window to guided modes is almost constant as the active region is placed at or close to various antinodes of a standing optical wave.

However, a transition occurs when the cavity length decreases to a point where the cavity order, $\text{Int}[2N_{GaN}L_c/\lambda]$, is smaller than $2N^2_{GaN}$ (note: the function $\text{Int}[X]$ rounds X to the nearest integer, $N_{GaN}$ is the index of refraction for GaN, $\lambda$ is the emission wave length in vacuum, $L_c$ is the cavity length). The number of modes extracted through Snell's window stays constant (i.e., one mode) whereas the number of guided modes continue to decrease, increasing the LEDs extraction efficiency. This regime of cavity length is called the microcavity regime and the RCLEDs that operate in this regime are called MCLEDs.

By employing a planar specular GEMM close to the active region of an LED, nano-optical cavity effects take place. The GEMM may be thick to be reflective so that the emission is directed away from the GEMM to be extracted through the top of the device, away from the substrate side. The GEMM may be thin to be semi-reflective so that the emission is directed through the semi-reflector to be extracted through Snell's window. Such a GEMM would be very useful in numerous LED structures as described herein.

To use the GEMM, as described above, it should have certain properties to allow for true epitaxial growth and commercialization of the MCLED, RCLED or engineered template. The GEMM should have to be compatible with III-nitride materials in the properties of lattice constant, thermal expansion coefficient, temperature stability, reflectivity, electrical properties, etc.

Figure 5:
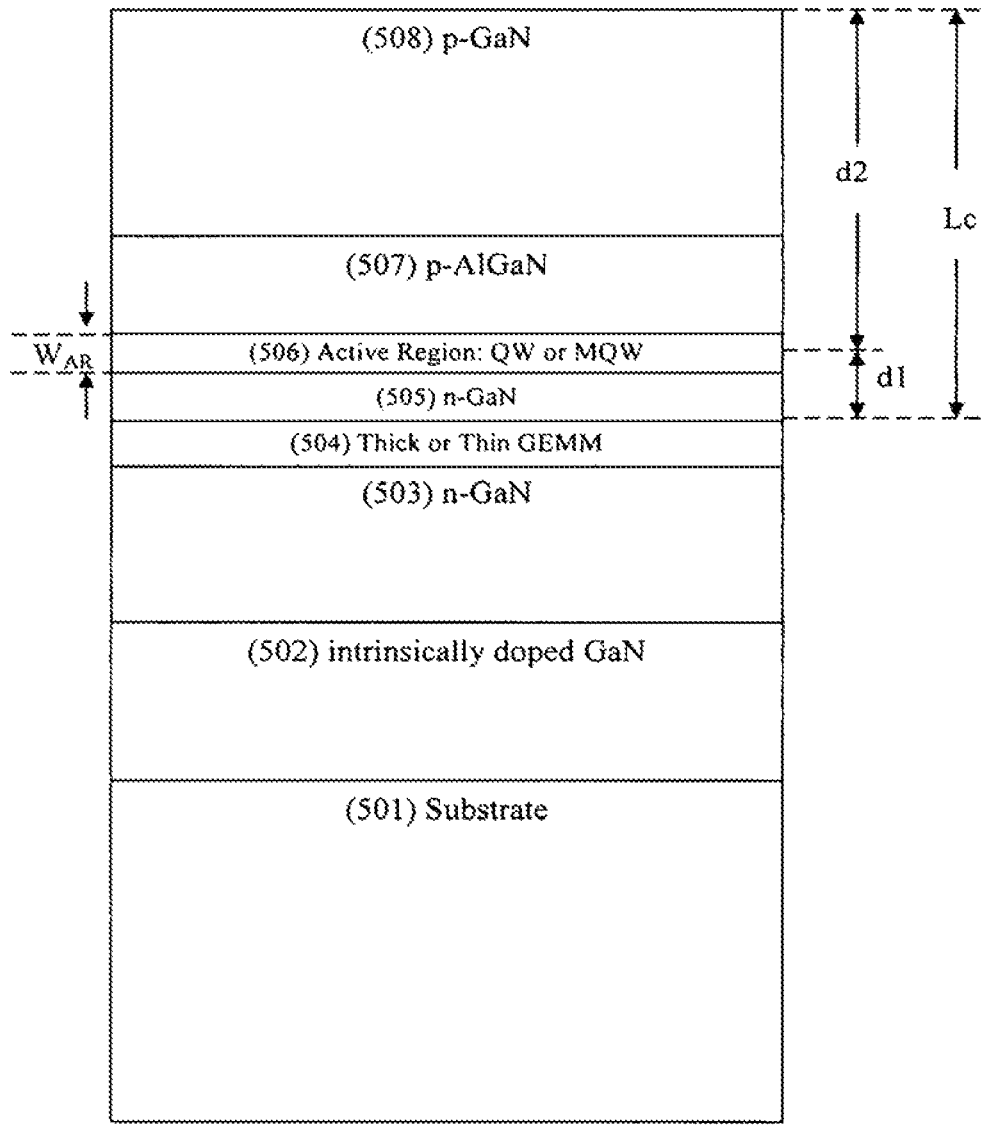
FIG. 5 illustrates an epitaxial stack of a III-nitride LED with GEMM according to the first, second, third and fourth embodiments of the invention.

Being that standing optical waves have a periodic function, a cavity light emitter may be such that the cavity is of an appropriate length and that the active region is placed at or close to an antinode of the standing optical wave. The structuring of the cavities herein follow the relationships where the cavity length $L_c$ is equal to d1+d2 as shown in FIG. 5 where:

$d1$ = the distance between the center of
the active region and the GEMM
= $(0.25 \lambda/N) + M(0.5 \lambda/N) - PD1$.

$d2$ = the distance between the center of the active region and
a second mirror or reflective interface
= $(0.25 \lambda/N) + M(0.5 \lambda/N) - PD2$
if the second mirror is a metal; and
= $(0.75 \lambda/N) + M(0.5 \lambda/N)$
if the second mirror is a DBR or roughened surface.

$\lambda$ is the wave length of light generated by the active region in vacuum.

N is the index of refraction of the III-nitride material.

M is an integral multiple of half wave lengths within the III-nitride material starting at zero.

PD1 and PD2 are the metal penetration depths of the light into the GEMM and the second mirror (if metal), respectively.

As the thickness of the GEMM layer is modified the resulting position of the PD (penetration depth) needs to be modified.

To be clear, the second mirror or extraction interface is positioned at the top of the p-GaN layer (508) in FIG. 5 away from the substrate (501).

To ensure that the active region is placed only at or close to an antinode of the standing optical wave, the thickness of the emitting region may be restricted to a value less than $0.25\lambda/N$. If the active region is positioned in such a way that it is not centered and extends outside of this width towards a node of the same mode the efficiency may be degraded.

The error for the placement of such an active region is dependent on the width of the active region. The thicker the active region is the less error there is for optimal performance. The error may be considered: $0.125(\lambda/N)-0.5(W_{AR})$, where $W_{AR}$ is the active region width, as illustrated in FIG. 5. If the error involved with the placement of the active region is breached the device will work however inefficiently unless other light extracting structures are made available such as a photonic crystal or crystals and roughed surfaces or other device shaping deviating from the standard LED.

Furthermore, a roughened surface or photonic crystal may assist in the light extraction of guided modes or mode. Moreover, the device may be designed that the guided elements are intentionally coupled to the features of the roughened or photonic crystal structures to form a "guided extraction mode." The device structure may be optimized to use the GEMM to exclusively extract guided modes through the use of micro-optical-cavity effects, specifically through the rearrangement of the freespace optical mode density. These methods may be in one or more embodiments below.

First Embodiment

Figure 6:
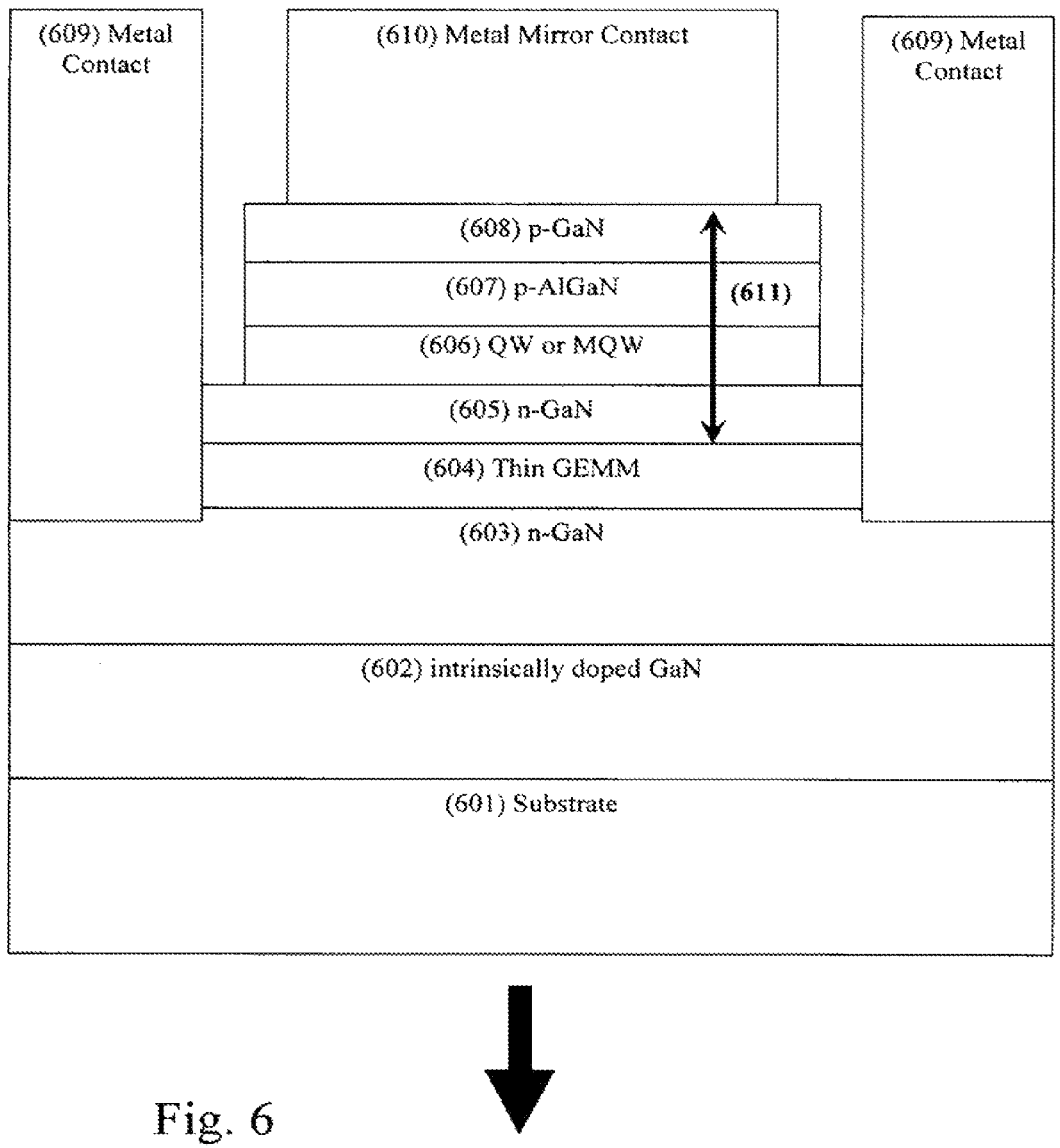
FIG. 6 illustrates a III-nitride Resonant Cavity LED (also known as microcavity LED) with GEMM and a non-epitaxial metal mirror for enhanced light extraction according to the first embodiment of the invention.
Figure 7:
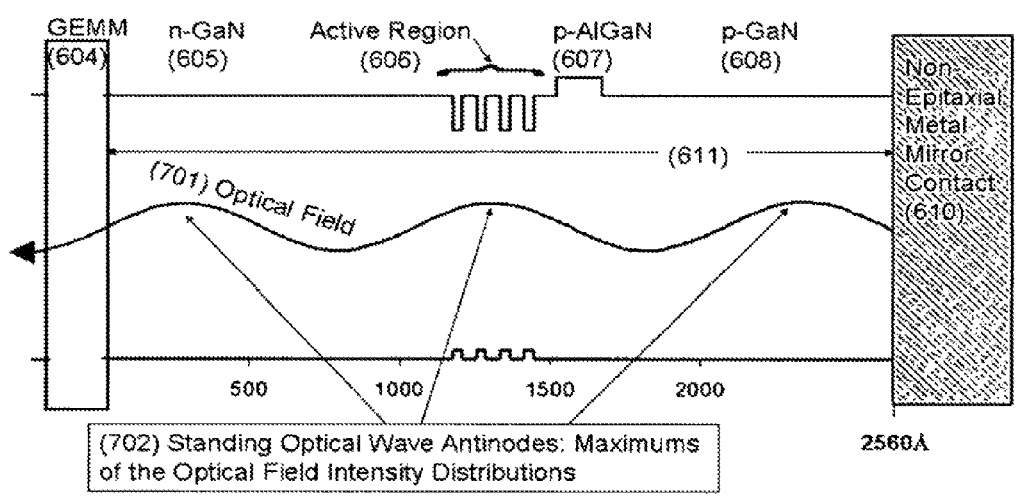
FIG. 7 illustrates a conduction and valence band diagram of the LED in FIG. 6 with optical field approximated.

The structure and band diagram of the first embodiment are shown in FIG. 6 and FIG. 7, respectively.

The GEMM (604) lends itself to many forms of optical cavity semiconductor light emitters. In the first embodiment the GEMM (604), with its highly reflective bulk properties, may be grown thin such that the GEMM (604) is partially transparent and partially reflective. The first embodiment utilizes a planar III-nitride material growth template comprising of sapphire substrate (601), i-GaN buffer layer (602) and n-GaN layer (603) of device quality so that the crystal quality of the GEMM (604) is planar, specular and of device quality. The GEMM (604) is lattice matched to the n-GaN layer (603) such that the desired thickness may be below the epitaxial critical thickness.

Once the 2 μm i-GaN buffer (602) and the 2 μm n-GaN (603) layers are grown on a sapphire substrate (601) the GEMM (604) may be grown to a specific thickness (~20 nm) for the resonant cavity (611) such that the GEMM is partially reflective and partially transparent. Once the GEMM (604) is grown on the n-GaN layer (603) the second n-GaN layer (605) may be grown to a specific thickness (~1200 Å) that is optimal for the resonant cavity (611) being that the active region (606) may be positioned at or close to an antinode (702) being a maximum the of the optical field (701) within a width of $0.25\lambda/N_{GaN}$ as shown in FIG. 7 ($N_{GaN}$ is the index of refraction, $\lambda$ is the emission wave length in vacuum).

In the first embodiment, the illustrated RCLED may emit at a wavelength of 500 nm with a cavity length (611) of about 3000 Å (being within the microcavity regime). The light generated in the active region (606) resonates between the thick, highly reflective non-epitaxial metal mirror (610) and the thin, partially reflective, partially transparent, GEMM (604). The cavity is such that the mirrors (604) (610) are spaced apart such that light generated by the active region (606) may resonate between the mirrors. The mirrors (604) (610) are spaced apart such that an integer number of half wave lengths of the light generated by the active region (606) may fit between the mirrors (604) (610) within the nitride materials. The active region (606) is placed in between the mirrors such that the generated light constructively interferes with the reflected light from both mirrors (604) (610). The resonating light exits the GEMM (604) side of the device through the sapphire substrate (601), as shown in FIGS. 6 and 7.

Positioning the center of the active region (606) of the MCLED at, or close to, a maximum (702) of the optical field distribution (701) is shown in FIG. 7. The local maximums (702) of the optical field distribution (701) are referred to as antinodes (702) because they are antinodes of the standing optical wave. Positioning the center of the active region (606) at or close to the closest antinodes to the non-epitaxial metal mirror (610) contact and the GEMM (604) is desired to reduce the number of guided modes and increase the light extraction through Snell's window. As shown in FIG. 7, antinodes (702) of the standing optical wave are positioned periodically away from the nonepitaxial metal mirror contact (610) and the GEMM (604).

The following factors should be considered for this embodiment:
a. the n-type GaN layer template (603) being of device quality and planar,
b. the thickness, flatness, specular reflectivity and transparency of the GEMM layer (604) grown on the first n-type GaN layer (603),
c. the thickness of second n-type conductive layer (605) grown on the GEMM (604) and its being of device quality,
d. the position of the active region (606) relative to the enclosing mirrors (604), (610),
e. the thickness of the p-type conductive layers (607) (608), and
f. the reflective quality of the non-epitaxial metal contact (610).

Although the device efficiency is superior to that of a standard LED, it may be of interest to detune the device in its construction such that the enhancements in directionality and spectral narrowing are substituted for even higher light extraction efficiency. This may be performed by keeping all parameters the same while increasing the wavelength of the device by adjusting the quantum well composition or width. This forces the standing optical wave into a tilted position away from the normal of the device. This adjustment may only be done such that the angle is within Snell's window; otherwise the light outside of the critical angel is reflected back into the device. The critical angle of Snell's window is defined as $\sin^{-1}(N_{exit}/N_{GaN})$ where $N_{exit}$ is the index of refraction external of the device and $N_{GaN}$ is the index of refraction of Gallium Nitride.

Although laser lift off is not required to form the MCLED, there may be benefits to removing the sapphire substrate (601) for thermal extraction or n-side surface roughening. Moreover, if the substrate is non-transparent (i.e., silicon) the silicon substrate may be selectively etched away, forming the functional device structure of FIG. 6, without the substrate, whether or not there is a buffer between the GEMM or not.

This example is not meant to be restrictive in that the cavity length, emission wavelength and structural aspects may be changed such that the active region is positioned optimally within the optical field of the extraction mode for a given emission wavelength and direction.

One example of a modification is utilizing a thinner non-epitaxial metal mirror (610) such that the thickness is about 20 nm like the GEMM (604) layer to emit light from both sides of the planar device.

Another example of a modification to the structure outlined in FIG. 6 is to position a ~20 μm GEMM layer on or within the p-GaN layer and replace the thick non-epitaxial metal mirror with a transparent metal contact such that light may escape from the top and the bottom of the device.

Another example comprises of a photonic crystal embedded within the structure of FIG. 6 to extract guided modes or to prevent guided modes from forming. This will be discussed more in the fourth embodiment.

Second Embodiment

Figure 8:
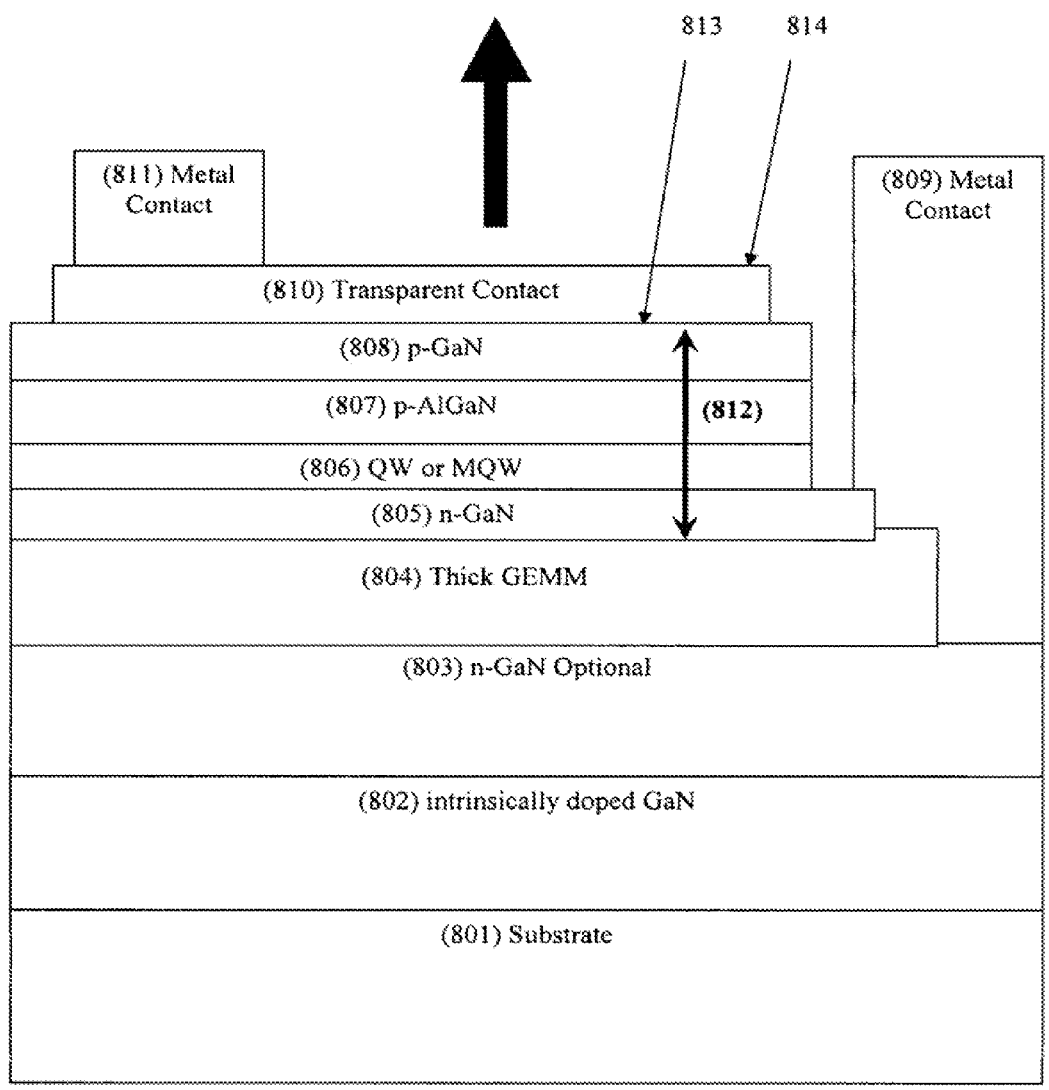
FIG. 8 illustrates a III-nitride resonant cavity LED with a GEMM and a nonepitaxial transparent conductor for enhanced light extraction according to the second embodiment of the invention.
Figure 9:
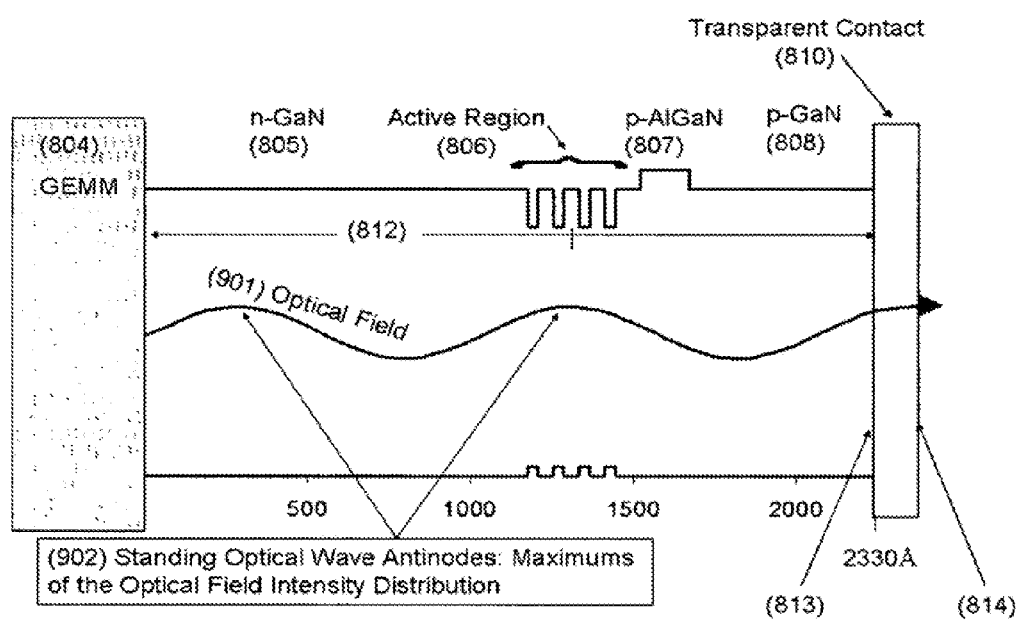
FIG. 9 illustrates a conduction and valence band diagram of the LED in FIG. 8 with optical field approximated.

The structure and band diagram of the second embodiment are shown in FIG. 8 and FIG. 9, respectively.

The GEMM (804) lends itself to many forms of optical cavity semiconductor light emitters. In the second embodiment the GEMM (804), with its highly reflective bulk properties, may be grown thick such that the GEMM (804) takes on its bulk reflective properties. The second embodiment utilizes a planar III-nitride material growth template comprising of sapphire substrate (801), i-GaN buffer layer (802) and n-GaN layer (803) of device quality so that the crystal quality of the GEMM (804) is planar, specular and of device quality. The GEMM (804) is lattice matched to the n-GaN layer (803) such that the desired thickness may be below the epitaxial critical thickness.

Once the 2 μm i-GaN buffer (802) and the 2 μm n-GaN (803) layers are grown on a sapphire substrate (801) the GEMM (804) may be grown to a thickness ($\gtrsim$(approximately greater than) 150 nm) for the resonant cavity (812). Once the GEMM (804) is grown the second n-GaN layer (805) may be grown to a specific thickness (~1260 Å) that is optimal for the resonant cavity (812) being that the active region (806) may be positioned at the local maximums (902) of the optical field (901) within a width of $0.25\lambda/N_{GaN}$ as shown in FIG. 9 ($N_{GaN}$ is the index of refraction, $\lambda$ is the emission wave length in vacuum).

In the second embodiment, the illustrated MCLED may emit at 500 nm with a cavity length (812) of about 2600 Å (being within the microcavity regime). The light being generated in the active region (806) resonates between the thick GEMM (804) and the interface (813) of the p-GaN layer (808) and the transparent contact (810). The cavity is such that the mirrors (804) (813) are spaced apart such that light generated by the active region (806) may resonate between the mirrors. The mirrors (804) (813) are spaced apart such that an integer number of half wave lengths plus one quarter wave length of the light generated by the active region (806) may fit between the mirrors (804) (813) within the nitride materials. The active region (806) is placed in between the mirrors such that the generated light constructively interferes with the reflected light. The resonating light exits the transparent contact (810) side of the device.

The positioning of the center of the active region (806) of the LED at, or close to, a maximum (902) of the optical field distribution (901) is shown in FIG. 9. The local maximums (902) of the optical field distribution (901) are referred to as antinodes (902) because they are the antinodes of the standing optical wave. Positioning the center of the active region (806) at or close to the closest antinodes to the mirrors is desired to reduce the number of guided modes and increase the light extraction through Snell's window. Positioning the mirrors so that the cavity length is small is most favored. As shown in FIG. 9, antinodes (902), of the standing optical wave, are positioned periodically away from the p-GaN/transparent conducting interface (813) and the GEMM (804).

The following factors should be considered for this embodiment:
a. the n-type GaN layer (803) or i-GaN buffer layer (802) template being of device quality and planar,
b. the thickness, flatness, and specular reflectivity of the GEMM layer (804) grown on the first n-type GaN layer (803),
c. the thickness of second n-type conductive layer (805) grown on the GEMM (804) and its being of device quality,
d. the position of the active region (806) relative to the enclosing mirrors (804), (813),
e. the thickness of the p-type conductive layers (807) (808), and
f. the reflective quality of p-GaN/transparent conductor interface (813) and the thickness of the transparent conductor (810).

Although the efficiency of this device is superior to that of a standard LED, it may be of interest to detune the device in its construction such that the enhancements in directionality and spectral narrowing are substituted for even higher light extraction efficiency. This may be performed by keeping all parameters the same while increasing the wavelength of the device by adjusting the quantum well composition or width. This forces the standing optical wave into a tilted position away from the normal of the device. This adjustment may only be done such that the angle is within Snell's window; otherwise the light outside of the critical angel is reflected back into the device. The critical angle of Snell's window is defined as $\sin^{-1}(N_{exit}/N_{GaN})$ where $N_{exit}$ is the index of refraction outside of the device and $N_{GaN}$ is the index of refraction of Gallium Nitride.

Although laser lift off is not required to form the MCLED there are benefits to removing the sapphire substrate (801) for thermal extraction and current injection from the removed substrate side of the device.

This example is not meant to be restrictive in that the cavity length, emission wavelength and structural aspects may be changed such that the active region is positioned optimally within the optical field of the cavity for a given emission wavelength and direction.

One example of a modification to the structure outlined in FIG. 8 is a ~20 nm GEMM positioned within or on the p-GaN layer (808) such that a GEMM layer is located at or close to a node in addition to the already present thick GEMM layer (804). The emitted light exits the p-GaN layer (808) side of the device. Additionally, in this way, a MCLED having a cavity order of one, may be achieved allowing for a ~90% light extraction efficiency if the mirrors enclose one antinode.

Third Embodiment

Figure 10:
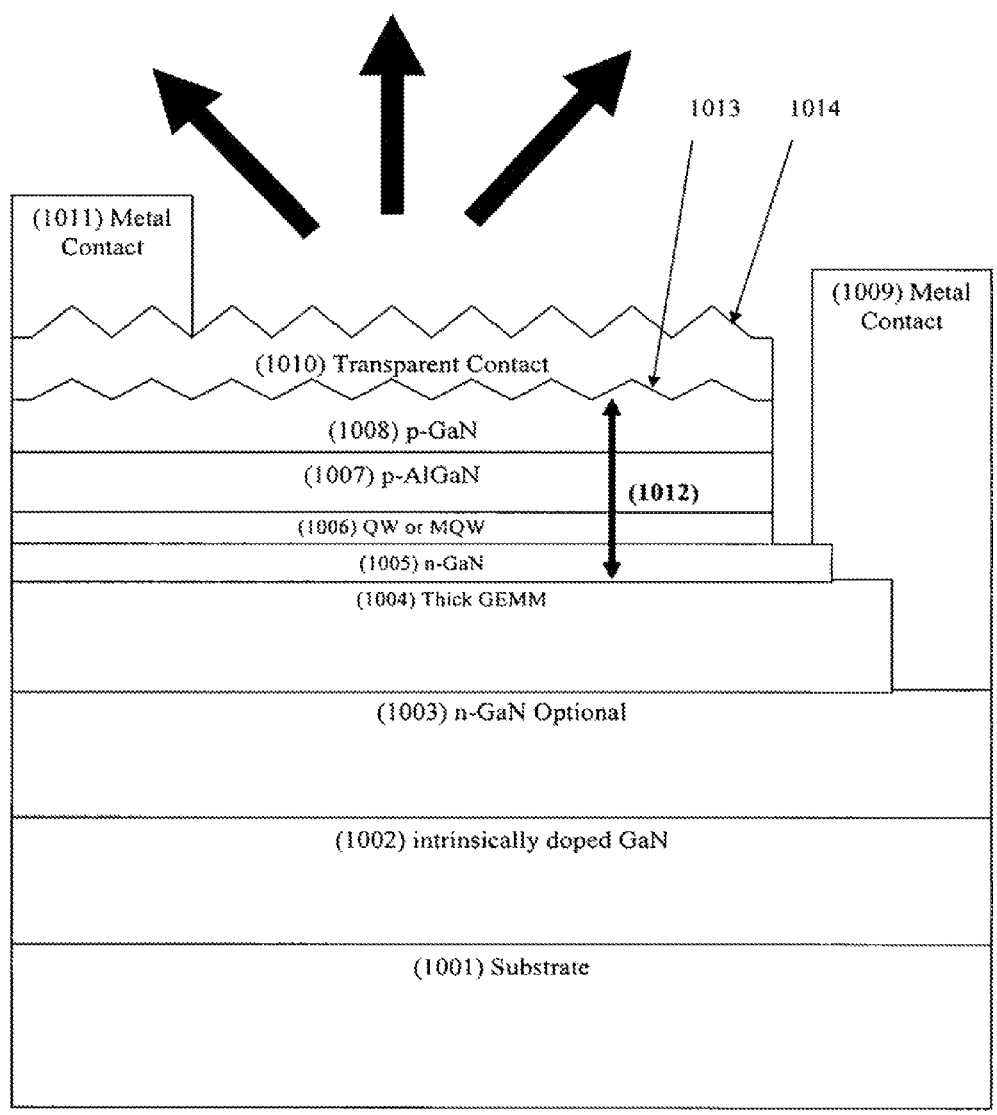
FIG. 10 illustrates a III-nitride surface roughened assisted resonant cavity LED with a GEMM coupled to a roughened p-GaN layer and non-epitaxial transparent conductor for enhanced light extraction according to the third embodiment of the invention.
Figure 11:
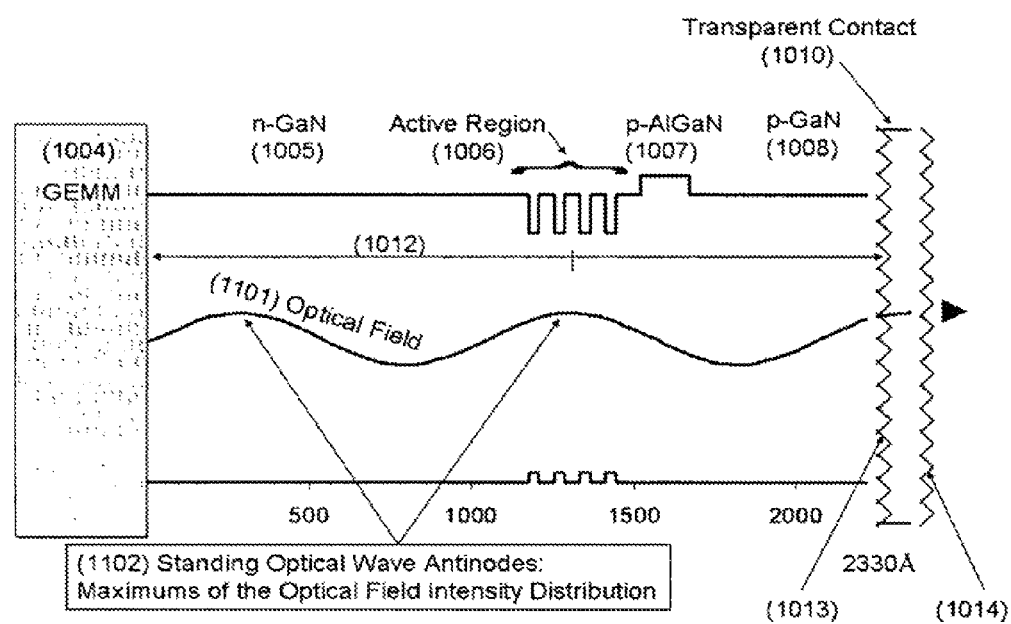
FIG. 11 illustrates a conduction and valence band diagram of the LED in FIG. 10 with optical field approximated.

The structure and band diagram of the third embodiment are shown in FIG. 10 and FIG. 11, respectively.

The GEMM (1004) lends itself to many forms of optical cavity semiconductor light emitters. In the third embodiment the GEMM (1004), with its highly reflective bulk properties, may be grown thick such that the GEMM (1004) takes on its bulk reflective properties. The third embodiment utilizes a planar III-nitride material growth template comprising of sapphire substrate (1001), i-GaN buffer layer (1002) and n-GaN layer (1003) of device quality so that the crystal quality of the GEMM (1004) is planar, specular and of device quality. The GEMM (1004) is lattice matched to the III-nitride n-GaN layer (1003) such that the desired thickness may be below the epitaxial critical thickness.

Once the 2 μm i-GaN buffer (1002) and the 2 μm n-GaN (1003) layers are grown on a sapphire substrate (1001) the GEMM (1004) may be grown to a thickness ($\gtrsim$(approximately greater than) 150 nm) for the surface roughened assisted resonant cavity (1012). Once the GEMM (1004) is grown on the template the second n-GaN layer (1005) may be grown to a specific thickness (~1260 Å) that is optimal for the optical cavity (1012) effects being that the center of the active region (1006) may be positioned at a local maximum (1102) of the optical field (1101) within a width of $0.25\lambda/N_{GaN}$ as shown in FIG. 11 ($N_{GaN}$ is the index of refraction, $\lambda$ is the emission wave length in vacuum).

The third embodiment with roughened p-GaN layer (1008) has several variations being that the roughened surface has features close to, or greater than, the wavelength of the emitted light within the semiconductor. The features may be random or ordered.

The roughened surfaces are not drawn to scale in FIGS. 10 and 11. The features are meant to only be representative.

If the features are random, the device may operate in such a way that the photons are given multiple opportunities to find an escape cone. If the light does not pass through Snell's window initially, the random reflecting surfaces, of the roughened interface, redirect emission at various angles towards the GEMM layer to be reflected to another position along the roughened interface. This process continues until the light is absorbed or escapes the light emitting device.

If the features are ordered the device may still operate in such a way that the photons are given multiple opportunities to find an escape cone if reflected back, however much of the light emitted from the active region toward the roughened p-type GaN layer surface may be scattered or diffracted and extracted.

Although the surface is roughened, Snell's law still applies; consideration must be made when determining the surface features such that the most of the impinging emission escapes. If the light propagating normal to the device is to escape the device, the angle between the normal of the surface feature and the normal of the device should be below the critical angle $\theta_c = \sin^{-1}(N_{OUT}/N_{GaN})$.

The illustrated optical cavity LED may emit at 500 nm with an effective cavity length (1012) of about 2600 Å (being within the microcavity regime). The light being generated in the active region (1006) self interferes constructively with the light reflecting from the thick GEMM (1004). Generally, the roughened surface should be positioned from the active region such that the semiconductor interface (1013) is positioned at or close to an antinode. The constructively interfering light exits the transparent contact (1010) side of the device.

Positioning the center of the active region (1006) of the LED at, or close to, a maximum (1102) of the optical field distribution (1101) is shown in FIG. 11. The local maximums (1102) of the optical field distribution (1101) are referred to as antinodes (1102) because they are antinodes of the standing optical wave. Positioning the center of the active region (1006) at or close to the closest antinodes to the GEMM (1004) is desired to reduce the number of guided modes and increase the light extraction through Snell's window. As shown in FIG. 11, antinodes (1102), of the standing optical wave, are positioned periodically away from the GEMM (1004).

The following factors should be considered for this embodiment:
a. the n-type GaN layer (1003) or i-GaN buffer layer (1002) template being of device quality and planar,
b. the thickness, flatness, and specular reflectivity of the GEMM layer (1004) grown on the first n-type GaN layer (1003),
c. the thickness of second n-type conductive layer (1005) grown on the GEMM (1004) and its being of device quality,
d. the position of the active region (1006) relative to the surrounding mirror (1004) and roughened surface,
e. the thickness of the p-type layers (1007) (1008), and
f. the thickness of the transparent conductor (1010).

Although laser lift off is not required to form the roughened surface assisted optical cavity LED there are benefits to removing the sapphire substrate for thermal extraction and current injection from the removed substrate side of the device.

This example is not meant to be restrictive in that the constructive interference length, emission wavelength and structural aspects may be changed such that the active region is positioned optimally within the optical field of the constructive interference length for a given emission wavelength and direction.

One example may be optimized by the emission impinging on the roughened surface entering into a surface feature such that the light is reflected within the feature from surface to surface until the light is at an angle such that the light may escape through Snell's window.

Another example may be optimized by exclusively extracting otherwise guided modes through the use of micro-optical-cavity effects, specifically through the rearrangement of the free space optical mode density such that the extraction mode is directed perpendicular to the extraction surface which is off axis from the normal of the planar substrate and subsequent layers. In this arrangement, vertical extraction modes may not be required and only guided modes or a single guided mode would be optimal for the device.

Fourth Embodiment

Figure 12:
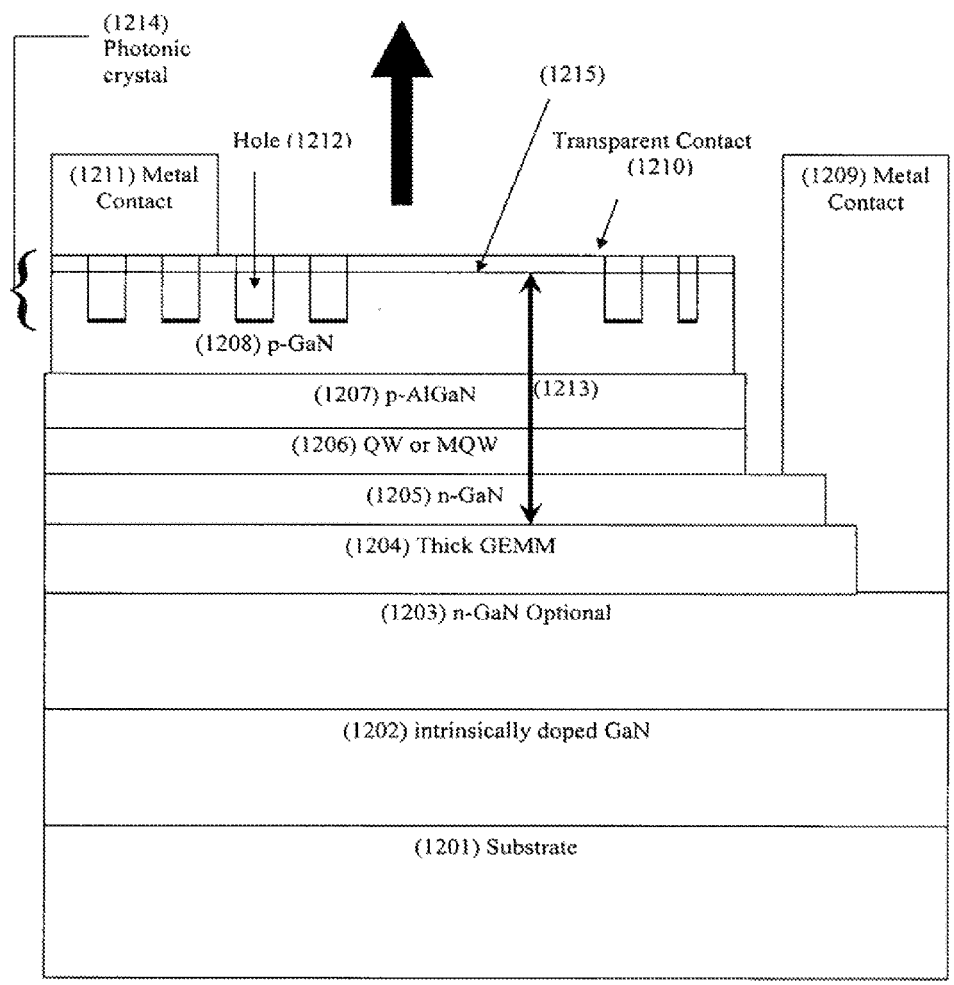
FIG. 12 illustrates a III-nitride photonic crystal assisted resonant cavity LED with a GEMM coupled to a photonic crystal structured p-GaN layer and nonepitaxial transparent conductor for enhanced light extraction according to the fourth embodiment of the invention.
Figure 13A:
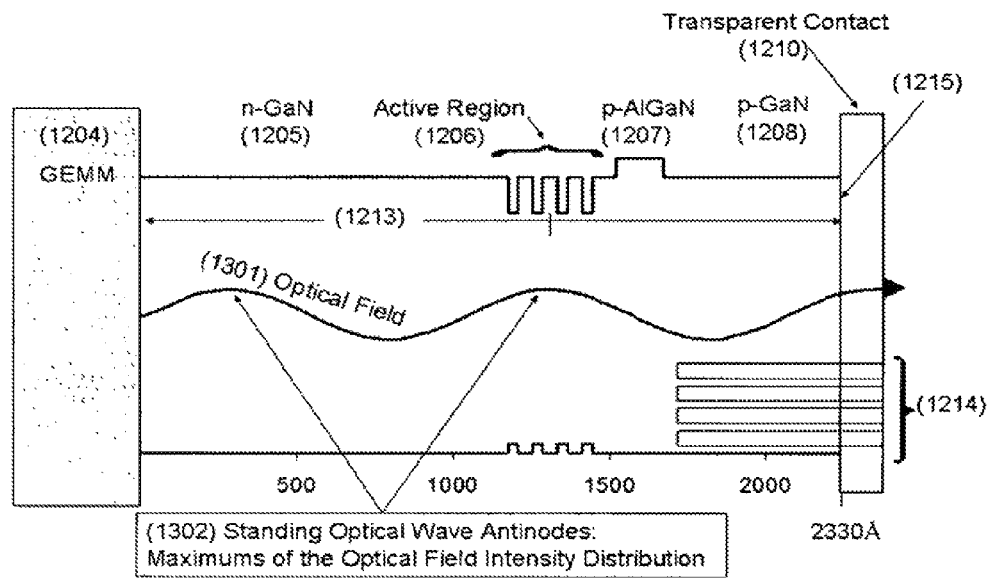
FIG. 13a illustrates a conduction and valence band diagram of the LED in FIG. 12 with optical field approximated according to the fourth embodiment of the invention.

The structure and band diagram of the fourth embodiment are shown in FIG. 12 and FIG. 13a, respectively.

The GEMM (1204) lends itself to many forms of optical cavity semiconductor light emitters. In the fourth embodiment the GEMM (1204), with its highly reflective bulk properties may be grown thick such that the GEMM (1204) takes on its bulk reflective properties. The fourth embodiment utilizes a planar III-nitride material growth template comprising of a sapphire substrate (1201), i-GaN buffer layer (1202) and n-GaN layer (1203) of device quality so that the crystal quality of the GEMM (1204) is planar, specular and of device quality. The GEMM (1204) is lattice matched to the n-GaN layer (1203) such that the desired thickness may be below the epitaxial critical thickness.

Once the 2 µm i-GaN buffer (1202) and the 2 µm n-GaN (1203) layers are grown on a sapphire substrate (1201) the GEMM (1204) may be grown to a thickness (≳(approximately greater than) 150 nm or greater) that is optimal for the photonic assisted resonant cavity. It is preferred to keep this layer below the critical thickness. Once the GEMM (1204) is grown on the template, the second n-GaN layer (1205) may be grown to a specific thickness (~1260 Å) that is optimal for optical cavity effects being that the active region (1206) may be positioned within the local maximum (1302) of the optical field (1301) within a width of $0.25\lambda/N_{GaN}$ as shown in FIG. 13a ($N_{GaN}$ is the index of refraction, $\lambda$ is the emission wavelength in vacuum).

The photonic crystal assisted resonant cavity LED with wave length scale two dimensional periodic structures (1213) may enhance the devices performance by adjusting several components: the positioning of the GEMM (1204), grating depth, grating spacing, grating hole width and grating fill factor. These components may be configured to manipulate guided modes (1303) by inhibiting the modes from formation, by extracting the guided modes via diffraction or by concentrating the guided modes via reflection to increase photon recycling or various combinations of these three configurations.

Figure 13B:
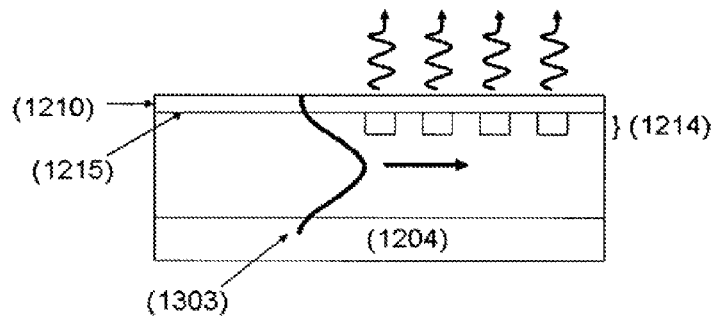
FIG. 13b illustrates a photonic crystal structure being utilized to extract guided modes according to the fourth embodiment of the invention.

In this fourth embodiment an example where the photonic crystal (1214) is used to extract guided modes (1303), as shown in FIG. 13b, is provided.

The photonic crystal structures are not drawn to scale in FIG. 12, FIG. 13a and FIG. 13b. The features are meant to only be representative.

In the fourth embodiment, a photonic crystal (1214) assisted RCLED may emit at 500 nm with a cavity length (1213) of about 2600 Å (being within the microcavity regime). The light being generated in the active region (1206) resonates between the thick GEMM (1204) and the interface (1215) of the p-GaN layer (1208) and the transparent contact (1210). The cavity is such that the mirrors (1204) (1215) are spaced apart such that light generated by the active region (1206) may resonate between the mirrors. The mirrors (1204) (1215) are spaced apart such that an integer number of half wave lengths plus one quarter wave length of the light generated by the active region (1206) may fit between the mirrors (1204) (1215) within the nitride materials. The active region (1206) is placed in between the mirrors such that the generated light constructively interferes with the reflected light. The resonating light exits the transparent contact (1210) side of the device.

The guided modes are subject to being diffracted vertically from the emitting surface as shown in FIG. 13b.

The following factors should be considered for this embodiment:

a. the first n-type GaN layer (1203) or i-GaN buffer (1202) template being of device quality and planar, b. fife thickness, flatness, and specular reflectivity of the GEMM layer (1204) grown on the first n-type GaN layer (1203), c. the thickness of second n-type conductive layer (1205) grown on the GEMM (1204) being of device quality, d. the position of the active region (1206) to the surrounding mirror (1204), semiconductor interface (1215) and photonic crystal (1214), e. the thickness of the p-type conductive layers (1207) (1208), and f. the depth and configuration of the holes (1212) in the photonic crystal (1214).

Although laser lift off is not required to form the Photonic Crystal assisted RCLED there are benefits to removing the sapphire substrate for thermal extraction and current injection from the removed substrate side of the device.

This example is not meant to be restrictive being the cavity length, photonic crystal grid and emission wavelength may be of various configurations such that the active region is centered at or close to an antinode within an extraction mode of the cavity and coupled photonic crystal.

One example of a modification to the structure outlined in FIG. 12 comprises of the transparent contact (1210) being replaced with a thick (≧(approximately greater than) 150 nm) reflective metal mirror with a reduction of the GEMM layer (1204) to about 20 nm in thickness. Moreover the cavity thickness (1213) is adjusted to place both metal mirrors close to nodes and the active region remains at or close to an antinode. Additionally, the photonic crystal is designed such that the generated guided light is diffracted into a vertical mode(s) or that the guided modes are inhibited. This configuration allows for the MCLED with a photonic crystal on the device side of the thick reflective metal mirror.

Although the holes in the p-GaN layer that make up the photonic crystal are not distributed evenly through out the layer of the drawing, this does not indicate that the photonic crystal structure can not be made more uniform. As indicated, there are several photonic crystal configurations.

Fifth, Sixth, Seventh and Eighth Embodiments

The fifth, sixth, seventh and eighth embodiments are similar to the first, second, third and fourth embodiments, respectively. The fifth, sixth, seventh and eighth embodiments have a different order in the epitaxial structure from the previous embodiments. In general, the n-type layer is grown before the p-type layers as described in the previous embodiments. The doped epitaxial layers and active region of the fifth, sixth, seventh and eighth embodiments grown in reverse order and summarized in Table I.

To be clear the general epitaxial order of the fifth, sixth, seventh, and eighth embodiments follows: Sapphire\i-GaN\GEMM\p-GaN\p-AlGaN\Active region\n-GaN. Examples of the epitaxial structure are summarized in Table I.

TABLE I

| Layer | Thickness | doping |
|---|---|---|
| n-GaN | Embodiment 5: ~120 nm<br>Embodiments 6, 7, 8*:<br>~126 nm<br>*Embodiment 8: Depends on photonic crystal arrangement | $5 \times 10^{18}$ cc/cm3 |
| Active Region | 4X ~3 nm InGaN/~6 nm GaN | NA |
| p-AlGaN | ~19 nm | $3 \times 10^{17}$ cc/cm3 |
| p-GaN | ~237 nm (Embodiment 5)<br>~214 nm (Embodiment 6, 7, 8) | $5 \times 10^{17}$ cc/cm3 |
| GEMM | ~20 nm (Embodiment 5)<br>≳ (approximately greater than) 150 nm (Embodiment 6, 7, 8) | NA |
| i-GaN | 2 μm | NA |
| Sapphire substrate | 300 μm | NA |

In the fifth embodiment the processing operations are the same as the first, however, a reflective ohmic contact is deposited on the n-GaN layer.

In the sixth, seventh and eighth embodiments the processing operations (FIG. 15-FIG. 17) are the same as the second, third and fourth embodiments, however, now the n-terminal and the p-terminal are substituted in place of the other.

The key aspects of positioning the center of the active region at or close to an antinode of the designed optical mode for a given emission, as described in the previous embodiments, is applied in these summarized embodiments.

Epitaxy and Processing

General Epitaxy Growth of the First, Second, Third and Fourth Embodiments

As an example, FIG. 5 illustrates the sequence of the epitaxial layers involved within the general base epitaxial structure for the first, second, third and fourth embodiments. Material layers are grown using Organo-Metalic Vapor Phase Epitaxy (OMVPE), Molecular Beam Epitaxy (MBE), Hydride Vapor Phase Epitaxy (HYPE), Physical Vapor Deposition (PVD) and the like, whether being a single tool or combinations and/or variations thereof. The growth conditions to produce these layers are subject to the tools used. For some embodiments an epitaxial structure comprises:

1. The growth of epitaxial material on a sapphire substrate (501). The quality of the subsequent epitaxial layers (502, 503, 504, 505, 506, 507, 508) that are formed above this substrate (501) may be dependant on the substrate (501) orientation, surface roughness and/or surface treatment.

2. Intrinsically doped GaN buffer layer (502). The layer is intrinsically doped GaN buffer layer that is about 2 μm thick. The quality of the subsequent epitaxial layers (503, 504, 505, 506, 507, 508) that are formed above this layer (502) may be dependent on the thickness of this layer and initial growth conditions when formed on the substrate (501).

3. Doped n-type GaN layer (503). The layer is 2 μm of Si-doped GaN which acts as an n-type layer for electrical conduction with the GEMM layer (504) within the processed light emitter. The density of charge carriers is about 5 times $10^{18}$ per cubic centimeter. The doping of this layer near the above GEMM (504) interface may be higher or lower to optimize ohmic operation. The quality of the subsequent epitaxial layers that are formed above this layer may be dependent on the thickness of this layer.

4. GEMM layer (504). The crystalline quality of this layer is dependent on the growth conditions and the crystalline quality of the previous layers (502) (503) and Substrate (501).

The GEMM layer (504) comprises of refractory metals and/or metallic compounds, such as the Group IVB metals (Zr, Hf and the like ($Hf_xZr_{1-x}$)), the Transitional Metal Diborides (ZrB2, HfB2, YB2 and the like ($Hf_xZr_yY_zB_2$ where x+y+z=1)) and Transitional Metal Nitrides (ZrN, HfN, TiN and the like ($Hf_xZr_yY_zN$ where x+y+z=1)).

As further examples, the thin GEMM (504) (604) used in the first and fifth embodiments may be about 20 nm in thickness such that it is partially transparent, reflective and weakly absorbing.

The thick GEMM (504) (804) (1004) (1204) used in the second, third, fourth and sixth, seventh eighth embodiments may be greater than about ≳ (approximately greater than) 150 nm in thickness such that it may take on its bulk reflective properties.

The thickness of the GEMM may be epitaxially grown below the crystalline relaxation critical thickness.

In the second (see FIG. 8 and FIG. 9) and sixth, third (see FIG. 10 and FIG. 11) and seventh and fourth (see FIG. 12 and FIG. 13) and eighth embodiments, the devices may be designed such that the generated light is to propagate through the device, away from the sapphire substrate, such that the thickness of the GEMM (504), (804), (1004), (1204) is thick enough to reflect with no light transmitting though the GEMM (504), (804), (1004), (1204).

The composition of the GEMM (504) may be such that this layer (504) may be lattice matched to the layers above and below. The GEMM (504) may be below the critical thickness. Critical thickness is a thickness where the built up strain due to lattice mismatch, composition and thickness is relaxed by forming defects in the material.

5. Thin Doped n-type layer (505). Si-doped GaN may act as an n-type layer in the light emitter and is one side of an optical cavity further comprising a single mirror or dual mirrors. The layer thickness may be such that the active region (506) should be located at or close to an antinode of the standing optical wave (maximum of the optical field). The density of charge carriers may be about 5 times $10^{18}$ per cubic centimeter. The doping of this layer near the interface of the below layer may be higher or lower to optimize the ohmic operation.

6. Active region of the light emitter (506). The active region may be comprised of 4 InGaN quantum wells 3 nm thick separated by undoped GaN barrier layers 6 nm thick. The quantum wells indium composition may be chosen to emit at any wavelength within the nitride wavelength range. Various thicknesses and compositions of quantum wells and thicknesses of the barriers may be grown, as long as the active region is localized at or close to an antinode of the standing optical wave. The active region (506) may be less than $\lambda/(4N)$ thick to position the active region at or close to an antinode of the cavity where $\lambda$ is the wave length of light generated by the active region in vacuum, N is the index of refraction of the III-nitride material.

7. Doped p-type AlGaN layer (507). This magnesium doped AlGaN layer (507) may be about 19 nm thick and may be an electron blocking layer. This layer may be thicker or thinner or may be omitted.

8. Doped p-type GaN layer (508). This magnesium doped GaN layer (508) may act as the p-type layer for electrical contact (610), (810), (1010), (1210) in the light emitting emitter. In the third embodiment (see FIG. 10 and FIG. 11), this layer (508), (1008) may be grown with such growth conditions so that the surface roughness is purposely enhanced.

General Epitaxy Growth of the Fifth, Sixth, Seventh and Eighth Embodiments

The epitaxial process for the fifth, sixth, seventh and eighth embodiments are similar to the previous embodiments. The structures are presented in Table I.

In these embodiments it may be desired to reduce possible Mg contamination within the active region by growing the p-GaN and p-AlGaN layers in a separate chamber from the rest of the semiconductor growth.

Processing Steps of First Embodiment

Figure 14:
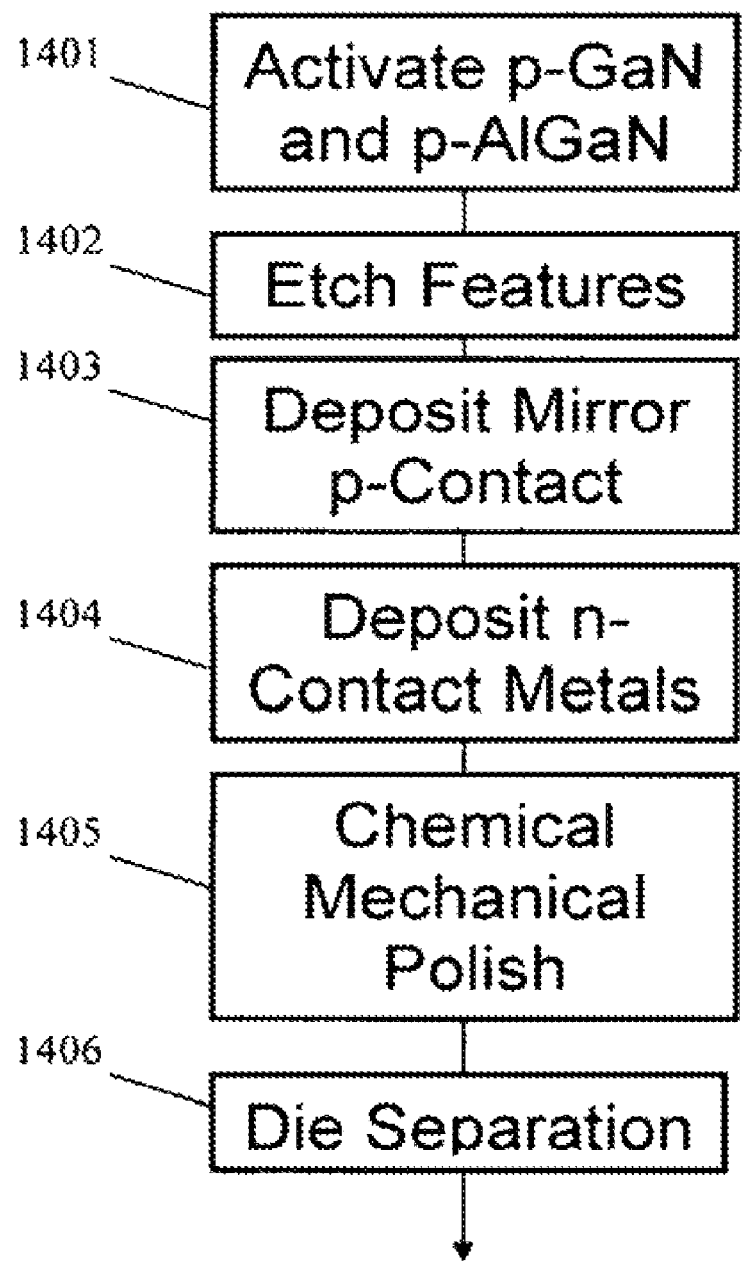
FIG. 14 illustrates a process flow diagram for LED of FIG. 6.

FIG. 14 is a flow chart illustrating exemplary processing steps to fabricate a MCLED or RCLED that may result from the epitaxial structure of FIG. 6. The device may be operated so that the light exits the transparent substrate (501) (601). The flow chart starts with the epitaxial structure of FIG. 5 as the base structure.

Block 1401 represents the step of activation of the p-GaN layer (508) (608) and/or p-AlGaN layer (507) (607). This comprises of activation of the Mg-doped layers thermally to reduce the p-GaN layer (508) (608) and/or pAlGaN layer (507) (607) resistivity. The sample is heated to 710° C. for 10 minutes in an atmosphere of $O_2$ and $N_2$.

Block 1402 represents the steps of mesa formation and n-GaN layer (503) (603)/thin GEMM (504) (604) contact etch. The mesas may be patterned by photolithography and etched by reactive ion etching to isolate the individual devices. Contacts may be patterned by photolithography on the mesas and etched by reactive ion etching to expose the n-GaN layer (503) (603) or epitaxial metal (504) (604) so that an electrical terminal (609) may be deposited later. The sample is etched in a chlorine atmosphere. Other etching techniques may be used.

Block 1403 represents the step of p-contact terminal deposition on the top of the mesa. A silver mirror (610) may be deposited by electron beam deposition to act as the electrical contact to the p-type GaN layer (508) (608). Any material that makes a good contact with the p-doped GaN layer and acts as a highly reflective metal mirror may be used. Other metal deposition techniques may be used.

Block 1404 represents the step of n-contact terminal deposition on top of the n-GaN layer and/or thin GEMM. The electrical contact of the n-doped GaN layer (503) (603) and/or thin GEMM (504) (604) may be defined by photolithography and then deposited by electron beam deposition on the nGaN layer (503) (603) and/or thin GEMM (504) (604). The contact is typically comprised of Ti/Al/Ni/Au (609). A ring shaped contact may be used to maximize the electrical injection into the device. Other metals and metal deposition techniques may be used.

Block 1405 represents the step of chemical mechanical polish. The back side of the transparent substrate (501) (601) may be thinned at this point for better thermal extraction and ease of die separation.

Block 1406 represents the step of die separation. The die separation may be performed by a scribe-and-break process, by a laser separation or a sawing process.

Processing Steps of Second Embodiment

Figure 15:
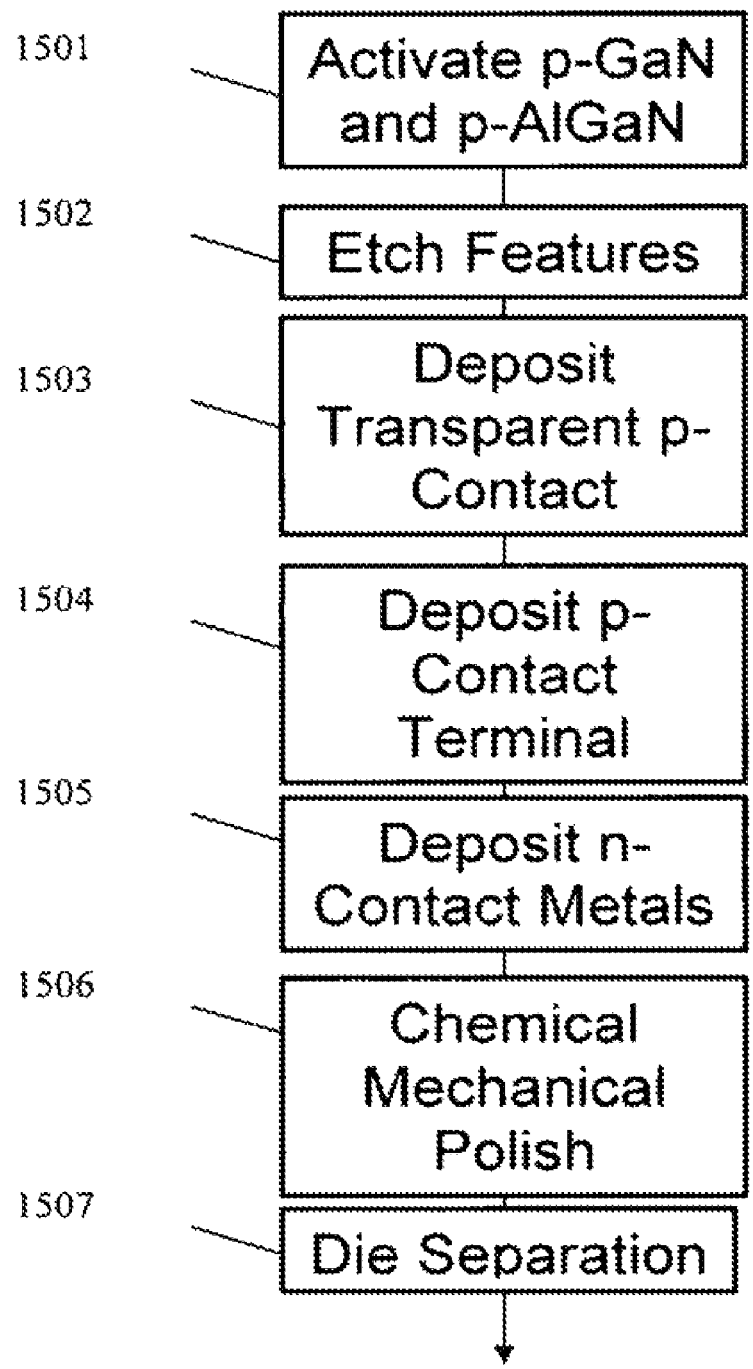
FIG. 15 illustrates a process flow diagram for LED of FIG. 8.

FIG. 15 is a flow chart illustrating exemplary processing steps to fabricate a MCLED, or RCLED that may result from the epitaxial structure of FIG. 8. The device may be operated so that the light exits the transparent contact (810). The flow chart starts with the epitaxial structure of FIG. 5 as the base structure.

Block 1501 represents the step of activation of the p-GaN layer (508) (808) and/or p-AlGaN layer (507) (807). This comprises of activation of the Mg-doped layers thermally to reduce p-type GaN layer (508) (808) and p-type AlGaN layer (507) (807) resistivity. The sample is heated to 710° C. for 10 minutes in an atmosphere of $O_2$ and $N_2$.

Block 1502 represents the steps of mesa formation and n-GaN layer (503) (803)/GEMM contact (504) (804) etch. The mesas may be patterned by photolithography and etched by reactive ion etching to isolate the individual devices. Contacts may be patterned by photolithography on the mesas and etched by reactive ion etching to expose the n-GaN layer (503) (803) or the GEMM layer (504) (804) so that an electrical terminal can be deposited later. The sample may be etched in a chlorine atmosphere. Other etching techniques may be used.

Block 1503 represents the step of p-contact deposition on the top of the mesa. A Ni/Au, ITO or any other transparent ohmic contact may be deposited by electron beam deposition to act as the electrical contact to the p-type GaN layer (508) (808). The top interface of the p-GaN layer (508) (808) layer performs as one side of the cavity. Other metals and metal deposition techniques may be used.

Block 1504 represents the step of p-contact terminal deposition on the top of the transparent ohmic p-contact (810). A p-type electrode (811) may be then formed on one side of the transparent conductive layer (810). The p-type electrode (811) may be made of any suitable material including, for example, Ni/Au, Pd/Au, Pd/Ni and Pt.

Block 1505 represents the step of n-contact terminal deposition on top of the n-GaN layer (503) (803) or (505) (805) and/or GEMM (504) (804). The electrical contact may be defined by photolithography and then deposited by electron beam deposition. The contact is typically comprised of Ti/Al/Ni/Au. A ring shaped contact may be used to maximize the electrical injection into the device. Other metals and metal deposition techniques may be used.

Block 1506 represents the step of chemical mechanical polish. The back side of the transparent substrate may be thinned at this point for better thermal extraction and ease of die separation.

Block 1507 represents the step of die separation. The die separation may be performed by a scribe-and-break process, by a laser separation or a sawing process.

Processing Steps of Third Embodiment

Figure 16:
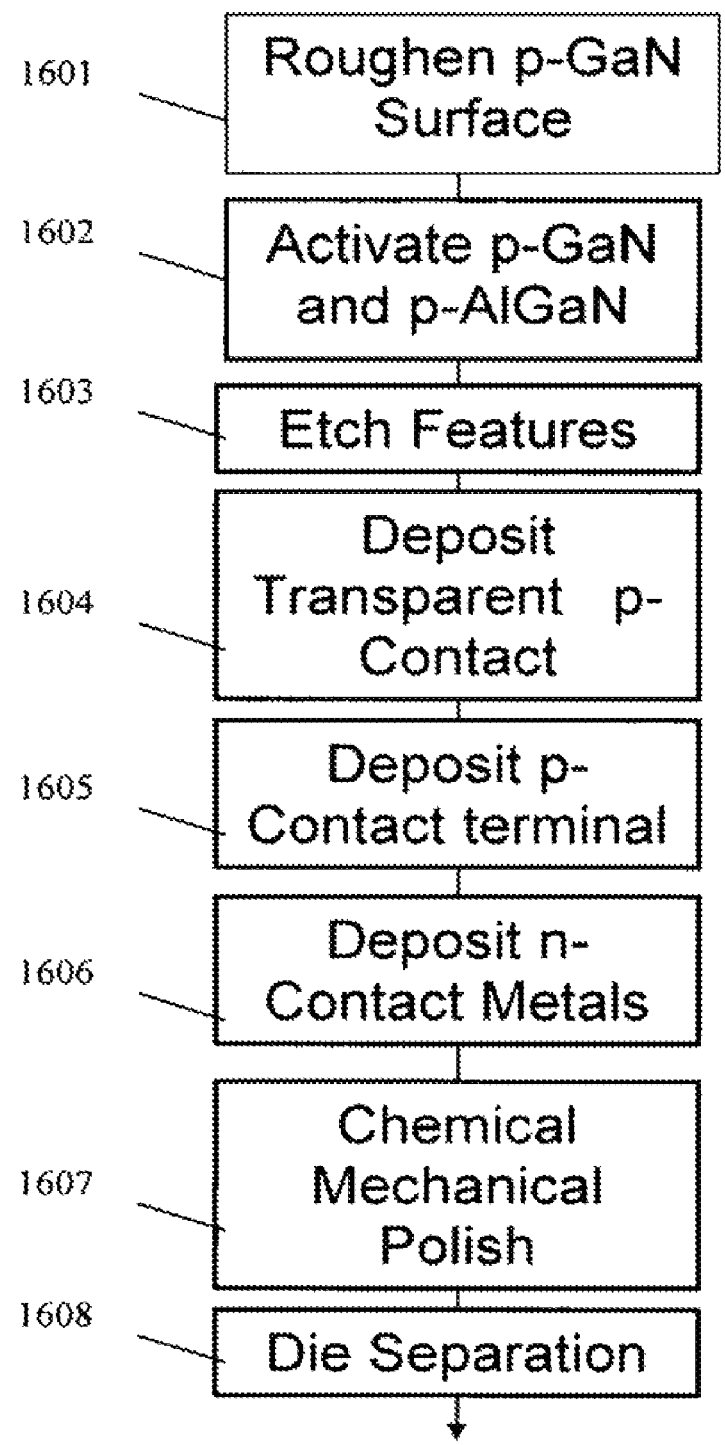
FIG. 16 illustrates a Process flow diagram for LED of FIG. 10.

FIG. 16 is a flow chart illustrating exemplary processing steps to fabricate a Roughened Surface Assisted MCLED, or RCLED that may result from the epitaxial structure of FIG. 10. The device may be operated so that the light exits the transparent contact (1010). The flow chart starts with the epitaxial structure of FIG. 5 as the base structure.

Block 1601 represents the roughening of the p-GaN layer (508) (1008). The roughening of the p-GaN layer (508) (1008) may be performed using several techniques. Some techniques include:
 a. cooler temperatures of the growth window during p-GaN layer (508) (1008) growth,
 b. electrochemical etching with or without photolithography,
 c. chemical etching with or without photolithography,
 d. ion etching with or without photolithography.

Block 1602 represents the step of activation of the p-GaN layer (508) (1008) and p-AlGaN layer (507) (1007). This comprises of activation of the Mg-doped layers thermally to reduce p-type GaN layer (508) (1008) and p-type AlGaN layer (507) (1007) resistivity. The sample is heated to 710° C. for 10 minutes in an atmosphere of $O_2$ and $N_2$.

Block 1603 represents the steps of mesa formation and n-GaN layer (503) (1003) /thick-GEMM contact (504) (1004) etch. The mesas may be patterned by photolithography and etched by reactive ion etching to isolate the individual devices. Contacts may be patterned by photolithography on the mesas and etched by reactive ion etching to expose the n-GaN layer (503) (1003) and/or GEMM (504) (1004) so that an electrical terminal may be deposited later. The sample may be etched in a chlorine atmosphere. Other etching techniques may be used.

Block 1604 represents the step of p-contact deposition on the top of the mesa. A Ni/Au, ITO or any other transparent ohmic contact may be deposited by electron beam deposition to act as the electrical contact to the p-type GaN layer (508) (1008). The bottom interface with the p-GaN layer (508) (1008) performs as one side of the cavity. Other metals and metal deposition techniques may be used.

Block 1605 represents the step of p-contact terminal deposition on the top of the transparent ohmic p-contact (1010). A p-type electrode (1011) may be then formed on one side of the transparent conductive layer (1010). The p-type electrode (1011) may be made of any suitable material including, for example, Ni/Au, Pd/Au, Pd/Ni and Pt.

Block 1606 represents the step of n-contact terminal deposition on top of the lower n-GaN layer (503) (1003) and/or thick GEMM (504) (1004) and/or upper n-GaN layer (505) (1005). The electrical contact (1009) may be defined by photolithography and then deposited by electron beam deposition. The contact (1009) is typically comprised of Ti/Al/Ni/Au. A ring shaped contact (1009) may be used to maximize the electrical injection into the device. Other metals and metal deposition techniques may be used.

Block 1607 represents the step of chemical mechanical polish. The back side of the transparent substrate may be thinned at this point for better thermal extraction and ease of die separation.

Block 1608 represents the step of die separation. The die separation may be performed by a scribe-and-break process, by a laser separation or a sawing process.

Processing of Fourth Embodiment

Figure 17:
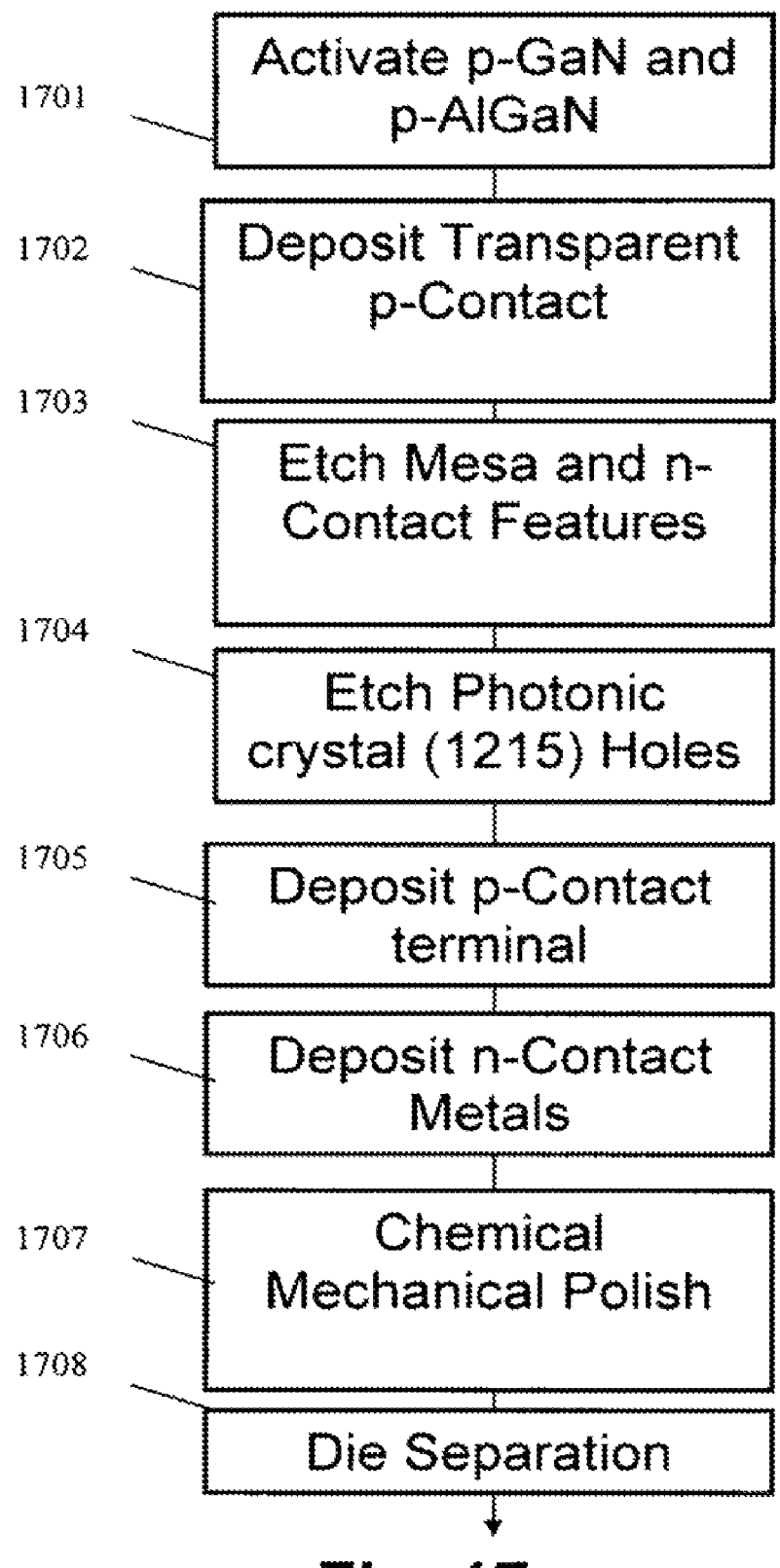
FIG. 17 illustrates a Process flow diagram for LED of FIG. 12.

FIG. 17 is a flow chart illustrating exemplary processing steps to fabricate a Photonic crystal (1214) Assisted MCLED, or RCLED that may result from the epitaxial structure of FIG. 12. The device may be operated so that the light exits the transparent-contact (1210)/photonic-crystal (1214) as illustrated in FIG. 12. The flow chart starts with the epitaxial structure of FIG. 5 as the base structure.

Block 1701 represents the step of activation of the p-GaN layer (508) (1208) and p-AlGaN layer (507) (1207). This comprises of activation of the Mg-doped layers thermally to reduce p-type GaN layer (508) (1208) and p-type AlGaN layer (507) (1207) resistivity. The sample is heated to 710° C. for 10 minutes in an atmosphere of $O_2$ and $N_2$.

Block 1702 represents the step of p-contact deposition on the top of the mesa. A Ni/Au, ITO or any other transparent ohmic contact may be deposited by electron beam deposition to act as the electrical contact to the p-type GaN layer. Other metals and metal deposition techniques may be used.

Block 1703 represents the steps of mesa formation and n-GaN layer (503) (1203)/GEMM contact (504) (1204) etch. The mesas may be patterned by photolithography and etched by reactive ion etching to isolate the individual devices. Contacts may be patterned by photolithography on the mesas and etched by reactive ion etching to expose the n-GaN layer (503) (1203) or thick GEMM (504) (1204) so that an electrical terminal may be deposited later. The sample may be etched in a chlorine atmosphere. Other etching techniques may be used.

Block 1704 represents the etching of holes (1212) into the p-GaN layer (1208). The etching of the p-type layers (1207) (1208) may be performed using several techniques. Some techniques include:
a. electrochemical etching with photolithography,
b. chemical etching with photolithography,
c. ion Etching with photolithography,
d. focused ion beam.

Block 1705 represents the step of p-contact terminal deposition on the top of the transparent ohmic p-contact (1210). A p-type electrode (1211) may then be formed on one side of the transparent conductive layer (1210). The p-type electrode (1211) may be made of any suitable material including, for example, Ni/Au, Pd/Au, Pd/Ni and Pt.

Block 1706 represents the step of n-contact terminal deposition on top of the n-GaN layer (503) (1203) or (505) (1205) and/or thick GEMM (504) (1204). The electrical contact may be defined by photolithography and then deposited by electron beam deposition. The contact is typically comprised of Ti/Al/Ni/Au. A ring shaped contact may be used to maximize the electrical injection into the device. Other metals and metal deposition techniques may be used.

Block 1707 represents the step of chemical mechanical polish. The back side of the transparent substrate may be thinned at this point for better thermal extraction and ease of die separation.

Block 1708 represents the step of die separation. The die separation may be performed by a scribe-and-break process, by a laser separation or a sawing process.

The thick GEMM (504) (1204) in this embodiment is greater than ≧(approximately greater than) 150 nm in thickness such that it takes on its bulk reflective properties. The thickness of the GEMM is epitaxially grown below the crystalline relaxation critical thickness.

Processing Steps of Fifth, Sixth, Seventh and Eighth Embodiments

The exemplary processing for the fifth, sixth, seventh and eighth embodiments are similar to the previous first, second, third, fourth embodiments, respectively. The epitaxial structure is presented in Table I.

To be clear, in the fifth embodiment, the new n-GaN layer contact may be made of metal materials that are highly reflective and provide the required ohmic operation.

In the sixth, seventh and eighth embodiments the transparent contact may not be required since the n-GaN layer itself is conductive enough that no current spreading layer is required. This more conductive n-GaN layer allows for the light exiting layer to be more easily modified by etching and photolithography techniques so that features may be formed for better light extraction.

Those that are skilled in the art understand that there are several processing options that may be changed. The important point of the processing steps it to allow the growth structure and optical cavity operation to be implemented.

Possible Modifications and Variations

A.) In alternative embodiments, the epitaxial crystal may be grown on other substrates (501) (601), (501) (801), (501) (1001), (501) (1201) for example, SiC, GaN, ZnO, MgO, glass, Si, GaAs, AlN, LiGaO$_2$, LiAlO$_2$, NdGaO$_3$, ScAlMgO$_4$, Ca$_8$La$_2$(PO$_4$)$_6$O$_2$. If the substrates are opaque they may be removed to allow light to exit during device operation.

B.) In alternative embodiments, the III-nitride buffer layer (502) (602), (502)(802), (502) (1002), (502) (1202) may thicker or thinner than 2 μm or may be doped to form electronic carriers.

C.) In alternative embodiments, the first deposited doped layer (503) (603), (503) (803), (503) (1003), (503) (1203) may be omitted if the GEMM (504) (604), (504) (804), (504) (1004), (504) (1204) is thick enough to sustain current flow for the device and if electrical terminals are connected to the GEMM (504) (604), (504) (804), (504) (1004), (504) (1204). (i.e. Bulk HfN is ~30× more conductive than moderately doped bulk n-GaN). It may be desired to keep this first doped layer for fabrication yields during the etch steps (1402), (1502), (1603), (1703).

D.) In embodiments one, two, three and four the p-GaN layer may have a tunnel junction and n-GaN layer added such that the new n-GaN layer is positioned such as to increase the conductivity and current spreading across the LED.

E.) The removal of the substrate (opaque or transparent) to access the crucial device epitaxial structure (partially transparent, partially reflective GEMM layer)/GaN/Active Region/GaN/(non epitaxial Metal mirror) in embodiment one or five may be another option for manufacturing, or device performance.

F.) The GEMM layer may be assisted with an epitaxial or nonepitaxial DBR with a phase matching layer positioned between the GEMM layer and the DBR.

G.) The thickness of the GEMM layer may be thicker or thinner in the embodiments presented. It is possible to modify these thicknesses to gain similar results from the embodiments. The thickness modification "window" can be large in various situations and should not be regarded as a major modification. What is important to these embodiments is the operation and the tailoring of the cavity effects explained herein.

H.) The GEMM may be used to promote stimulated emission and photon recycling in the device, and thereby increase the quantum efficiency of the device.

CONCLUSION

Those skilled in the art will appreciate that other modifications can be made without departing from the spirit of the innovative concept described herein. It is not intended that the scope of the invention be limited to the specific embodiments illustrated and described in the embodiments.

What is claimed is:
1. A light emitter comprising:
a crystalline III-nitride layer;
a first mirror having a first major face that is epitaxially coupled to a first major face of the crystalline III-nitride layer and includes a metal;
a second mirror;
an active region epitaxially coupled to a second major face of the first mirror that is opposite the first major face of the first mirror such that the first mirror, the active region, and the second mirror form a resonant-cavity light-emitting diode (RC-LED),
wherein the crystalline III-nitride layer and the first mirror have lattice constants that are substantially equal to one another.
2. The light emitter of claim 1, wherein the second mirror is epitaxially coupled to the active region and includes a metal.
3. The light emitter of claim 1, further comprising a substrate that is in contact with a second surface of the crystalline III-nitride layer that is opposite the first surface of the crystalline III-nitride layer and that includes at least one of the following:
Sapphire, Silicon, Silicon Carbide, Zinc Oxide, Spinel (MgAl$_2$O$_4$), AlN, GaP, MgO, LiGaO$_2$, LiAlO$_2$, NdGaO$_3$, ScAlMgO$_4$, and Ca$_8$La$_2$(PO$_4$)$_6$O$_2$.

4. The light emitter of claim 1, wherein the first mirror includes zirconium nitride.

5. The light emitter of claim 1, wherein the first mirror includes hafnium nitride.

6. The light emitter of claim 1, wherein the first mirror includes titanium nitride.

7. The light emitter of claim 1, wherein the first mirror includes yttrium nitride.

8. The light emitter of claim 1, wherein the first mirror, the active region, and the second minor form a micro-cavity light-emitting diode (MCLED).

9. The light emitter of claim 1, wherein a bottom surface of the crystalline III-nitride layer is roughened.

10. The light emitter of claim 1, wherein the second minor has a roughened top surface located opposite of the active region.

11. The light emitter of claim 1, wherein the second minor includes a photonics crystal.

12. The light emitter of claim 1, wherein the second minor includes a distributed Bragg reflector (DBR).

13. The light emitter of claim 1 further comprising, a distributed Bragg reflector (DBR) located between, and coupled to, the first mirror and the active region.

14. A light emitting device comprising:
a substrate;
a first III-nitride layer in contact with the substrate, wherein the first III-nitride layer has a first conductivity type and a first bandgap energy;
a planar specular epitaxial first metal-mirror layer in contact with the first III-nitride layer;
a second III-nitride layer in contact with the planar specular epitaxial first metal mirror layer, wherein the second III-nitride layer has a second conductivity type and a second bandgap energy;
a light-emitting layer in contact with the second III-nitride layer;
a third III-nitride layer in contact with the light-emitting layer, wherein the third III-nitride layer has a third conductivity type and a third bandgap energy;
a fourth III-nitride layer in contact with the third III-nitride layer, wherein the fourth III-nitride layer has a fourth conductivity type and a fourth bandgap energy; and
a second metal-mirror layer in contact with the fourth III-nitride layer,
wherein the first III-nitride layer and the first metal mirror layer have lattice constants that are substantially equal to one another.

15. The light emitting device of claim 14,
wherein the first conductivity type and the second conductivity type are equal types and the third conductivity type and the fourth conductivity type are equal types, and
wherein the first bandgap energy, the second band gap energy, and the fourth bandgap energy are substantially equal to one another, and are less than the third bandgap energy.

16. The light emitting device of claim 14, wherein the light-emitting layer includes at least one quantum well.

17. The light emitting device of claim 14, wherein the first metal minor layer has a thickness that is approximately 20 nm such that the first metal mirror layer is partially reflective and partially transmissive.

18. The light emitting device of claim 14, further comprising a photonic crystal structure embedded in the fourth III-nitride layer.

19. A light emitting device comprising:
a substrate;
a first III-nitride layer in contact with the substrate, wherein the first III-nitride layer has a first conductivity type and a first bandgap energy;
a planar specular epitaxial metal mirror layer in contact with the first III-nitride layer;
a second III-nitride layer in contact with the planar specular epitaxial metal mirror layer, wherein the second III-nitride layer has a second conductivity type and a second bandgap energy;
a light-emitting layer in contact with the second III-nitride layer;
a third III-nitride layer in contact with at least a portion of the light-emitting layer, wherein the third III-nitride layer has a third conductivity type and a third bandgap energy;
a fourth III-nitride layer in contact with the third III-nitride layer, wherein the fourth III-nitride layer has a fourth conductivity type and a fourth bandgap energy; and
a transparent contact layer in contact with the fourth III-nitride layer,
wherein the first III-nitride layer and the metal mirror layer have lattice constants that are substantially equal to one another.

20. The light emitting device of claim 19, wherein the metal minor layer has a thickness that is at least approximately 150 nm such that the metal minor is highly reflective.

* * * * *